(12) United States Patent
Ma

(10) Patent No.: US 12,543,603 B2
(45) Date of Patent: Feb. 3, 2026

(54) SEMICONDUCTOR PACKAGE

(71) Applicant: Samsung Electronics Co., Ltd., Suwon-si (KR)

(72) Inventor: Keumhee Ma, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 389 days.

(21) Appl. No.: 18/132,749

(22) Filed: Apr. 10, 2023

(65) Prior Publication Data

US 2024/0038725 A1 Feb. 1, 2024

(30) Foreign Application Priority Data

Jul. 26, 2022 (KR) .................. 10-2022-0092645

(51) Int. Cl.
*H01L 25/065* (2023.01)
*H01L 23/00* (2006.01)
*H10B 80/00* (2023.01)

(52) U.S. Cl.
CPC .......... *H01L 25/0657* (2013.01); *H01L 24/08* (2013.01); *H01L 24/16* (2013.01); *H01L 24/32* (2013.01); *H01L 24/73* (2013.01); *H10B 80/00* (2023.02); *H01L 24/29* (2013.01); *H01L 2224/0801* (2013.01); *H01L 2224/16148* (2013.01); *H01L 2224/26145* (2013.01); *H01L 2224/29187* (2013.01); *H01L 2224/2919* (2013.01); *H01L 2224/32053* (2013.01); *H01L 2224/32055* (2013.01); *H01L 2224/32056* (2013.01); *H01L 2224/32059* (2013.01); *H01L 2224/32145* (2013.01); *H01L 2224/73204* (2013.01); *H01L 2225/06513* (2013.01); *H01L 2225/06524* (2013.01); *H01L 2225/06527* (2013.01); *H01L 2225/06541* (2013.01); (Continued)

(58) Field of Classification Search
None
See application file for complete search history.

(56) References Cited

U.S. PATENT DOCUMENTS

| 7,612,450 B2 | 11/2009 | Lee et al. |
| 8,154,135 B2 | 4/2012 | Kim et al. |

(Continued)

FOREIGN PATENT DOCUMENTS

KR 101651272 B1 8/2016

*Primary Examiner* — Hung K Vu
(74) *Attorney, Agent, or Firm* — Muir Patent Law, PLLC

(57) ABSTRACT

A semiconductor package includes a first semiconductor chip including a first semiconductor substrate, and a first upper pad arranged on an upper surface of the first semiconductor substrate, a first polymer layer arranged on the upper surface of the first semiconductor substrate, a second semiconductor chip mounted on the first semiconductor chip, the second semiconductor chip including a second semiconductor substrate and a second lower pad arranged under a lower surface of the second semiconductor substrate, wherein the first polymer layer has a horizontal width in a direction crossing the first polymer layer in a center region of the second semiconductor chip, as a first length, and has a horizontal width in a direction crossing two corner regions of the first polymer layer in corner regions of the second semiconductor chip, as a second length, wherein the second length is greater than the first length.

20 Claims, 19 Drawing Sheets

(52) U.S. Cl.
CPC ............... *H01L 2225/06568* (2013.01); *H01L 2924/1431* (2013.01); *H01L 2924/1434* (2013.01)

(56) References Cited

U.S. PATENT DOCUMENTS

| | | | |
|---|---|---|---|
| 8,957,526 B2 | 2/2015 | Chun et al. | |
| 9,502,341 B2 | 11/2016 | Song et al. | |
| 9,659,833 B2 | 5/2017 | Lee et al. | |
| 10,043,780 B2 | 8/2018 | Choi et al. | |
| 2006/0131740 A1* | 6/2006 | Kawabata | H01L 25/105 |
| | | | 257/E21.503 |
| 2012/0256310 A1* | 10/2012 | Ide | H01L 21/76898 |
| | | | 257/E23.06 |
| 2021/0183816 A1* | 6/2021 | Jun | H01L 25/0657 |
| 2021/0343689 A1 | 11/2021 | Park et al. | |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0092645, filed on Jul. 26, 2022 in the Korean Intellectual Property Office, the disclosure of which is incorporated by reference herein in its entirety.

BACKGROUND

The inventive concept relates to a semiconductor package, and more particularly, to a semiconductor package including a plurality of semiconductor chips, which are vertically stacked.

It is desirable that the storage capacity of a semiconductor chip increases and at the same time, a semiconductor package including the semiconductor chip is thin and lightweight. In addition, there is a trend in research to include semiconductor chips having various functions in a semiconductor package, and drive the semiconductor chips to operate fast. In addition, research has been actively progressed to reduce the thickness of an adhesive layer in a highly stacked semiconductor package.

SUMMARY

The inventive concept provides a semiconductor package for reducing a fillet phenomenon of an adhesive layer.

The inventive concept provides a semiconductor package including an adhesive layer having improved coverage quality.

In addition, the issues to be solved by the technical idea of the inventive concept are not limited to those mentioned above, and other issues may be clearly understood by those of ordinary skill in the art from the following descriptions.

According to an aspect of the inventive concept, a semiconductor package includes a first semiconductor chip including a first semiconductor substrate, a first through electrode penetrating in a vertical direction at least a portion of the first semiconductor substrate, and a first upper pad arranged on an upper surface of the first semiconductor substrate, connected to the first through electrode, and having a first thickness, a first polymer layer arranged on the upper surface of the first semiconductor substrate and having a second thickness, a second semiconductor chip mounted on the first semiconductor chip, the second semiconductor chip including a second semiconductor substrate and a second lower pad arranged under a lower surface of the second semiconductor substrate, a first connection terminal arranged between the first upper pad of the first semiconductor chip and the second lower pad of the second semiconductor chip, and a first adhesive layer arranged between the first semiconductor chip and the second semiconductor chip, and surrounding each of the first upper pad, the second lower pad, and the first connection terminal. The first polymer layer has a first length measured along a first straight line extending in a center region of the second semiconductor chip and a second length measured along a second straight line crossing two corner regions of the first polymer layer. The two corner regions of the first polymer layer correspond to two corner regions of corner regions of the second semiconductor chip. The first straight line and the second straight line that extend in a first direction are parallel with each other and are spaced apart from each other in a second direction different from the first direction, and the first and second directions are perpendicular to the vertical direction. The second length is greater than the first length.

According to an aspect of the inventive concept, a semiconductor package includes a first semiconductor chip including a first semiconductor substrate, a first through electrode penetrating in a vertical direction at least a portion of the first semiconductor substrate, and a first upper pad arranged on an upper surface of the first semiconductor substrate, connected to the first through electrode, and having a first thickness, a first polymer layer arranged on the upper surface of the first semiconductor substrate and having a second thickness, a second semiconductor chip mounted on the first semiconductor chip, the second semiconductor chip including a second semiconductor substrate, a second through electrode penetrating at least a portion of the second semiconductor substrate, a second lower pad arranged under a lower surface of the second semiconductor substrate, and a second upper pad arranged on an upper surface of the second semiconductor substrate, connected to the second through electrode, and having a third thickness, a second polymer layer arranged on the upper surface of the second semiconductor substrate, and having a fourth thickness, a third semiconductor chip mounted on the second semiconductor chip, the third semiconductor chip including a third semiconductor substrate and a third lower pad arranged under a lower surface of the third semiconductor substrate, a first connection terminal arranged between the first upper pad of the first semiconductor chip and the second lower pad of the second semiconductor chip, a second connection terminal arranged between the second upper pad of the second semiconductor chip and the third lower pad of the third semiconductor chip, a first adhesive layer arranged between the first semiconductor chip and the second semiconductor chip, and surrounding each of the first upper pad, the second lower pad, and the first connection terminal, and a second adhesive layer arranged between the second semiconductor chip and the third semiconductor chip, and surrounding each of the second upper pad, the third lower pad, and the second connection terminal. The first polymer layer has a first length measured along a first straight line extending in a center region of the second semiconductor chip and a second length measured along a second straight line crossing two corner regions of the first polymer layer. The two corner regions of the first polymer layer correspond to two corner regions of corner regions of the second semiconductor chip. The second length is greater than the first length. The second polymer layer has a third length measured along a third straight line extending in a center region of the third semiconductor chip and a fourth length measured along a fourth straight line crossing two corner regions of the second polymer layer. The two corner regions of the second polymer layer correspond to two corner regions of corner regions of the third semiconductor chip. The fourth length is greater than the third length. The first straight line, the second straight line, the third straight line, and the fourth straight line extend in a first direction and are parallel with each other. The first straight line, the second straight line, the third straight line, and the fourth straight line are spaced apart from each other in a second direction different from the first direction, and the first and second directions are perpendicular to the vertical direction.

According to an aspect of the inventive concept, a semiconductor package includes a first semiconductor chip including a first semiconductor substrate, a first through electrode penetrating in a vertical direction at least a portion of the first semiconductor substrate, and a first upper pad arranged on an upper surface of the first semiconductor substrate, connected to the first through electrode, and having a first thickness, a first polymer layer arranged on the upper surface of the first semiconductor substrate and having a second thickness, a second semiconductor chip mounted on the first semiconductor chip, the second semiconductor chip including a second semiconductor substrate, a second through electrode penetrating at least a portion of the second semiconductor substrate, a second lower pad arranged under a lower surface of the second semiconductor substrate, and a second upper pad arranged on an upper surface of the second semiconductor substrate, connected to the second through electrode, and having a third thickness, a second polymer layer arranged on the upper surface of the second semiconductor substrate and having a fourth thickness, a third semiconductor chip mounted on the second semiconductor chip, the third semiconductor chip including a third semiconductor substrate, and a third lower pad arranged under a lower surface of the third semiconductor substrate, a first connection terminal arranged between the first upper pad of the first semiconductor chip and the second lower pad of the second semiconductor chip, a second connection terminal arranged between the second upper pad of the second semiconductor chip and the third lower pad of the third semiconductor chip, a first adhesive layer arranged between the first semiconductor chip and the second semiconductor chip, and surrounding each of the first upper pad, the second lower pad, and the first connection terminal, and a second adhesive layer arranged between the second semiconductor chip and the third semiconductor chip, and surrounding each of the second upper pad, the third lower pad, and the second connection terminal. The first polymer layer has a first length measured along a first straight line extending in a center region of the second semiconductor chip and a second length measured along a second straight line crossing two corner regions of the first polymer layer. The two corner regions of the first polymer layer correspond to two corner regions of corner regions of the second semiconductor chip. The second length is greater than the first length. The second polymer layer has a third length measured along a third straight line extending in a center region of the third semiconductor chip and a fourth length measured along a fourth straight line crossing two corner regions of the second polymer layer. The two corner regions of the second polymer layer correspond to two corner regions of corner regions of the third semiconductor chip. The fourth length is greater than the third length. The first straight line, the second straight line, the third straight line, and the fourth straight line extend in a first direction and are parallel with each other. The first straight line, the second straight line, the third straight line, and the fourth straight line are spaced apart from each other in a second direction different from the first direction, and the first and second directions are perpendicular to the vertical direction. The center region of the second semiconductor chip comprises a center point of the lower surface of the second semiconductor substrate. The corner regions of the second semiconductor chip comprise four vertex points of the lower surface of the second semiconductor substrate, respectively. The first length of the first polymer layer is a length selected from a range of about 60% to about 90% of a fifth length between opposite edges, spaced apart from each other in the first direction, of the second semiconductor chip, and the second length of the first polymer layer is a length from a range of about 100% to about 120% of the fifth length between of the second semiconductor chip. The third length of the second polymer layer is a length selected from a range of about 60% to about 90% of a sixth length between opposite edges, spaced apart from each other in the first direction, of the third semiconductor chip, and the fourth length of the second polymer layer is a length selected from a range of about 100% to about 120% of the sixth length of the third semiconductor chip. The second thickness of the first polymer layer is a thickness selected from a range of about 100% to about 180% of the first thickness of the first upper pad. The fourth thickness of the second polymer layer is a thickness selected from a range of about 60% to about 100% of the third thickness of the second lower pad.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
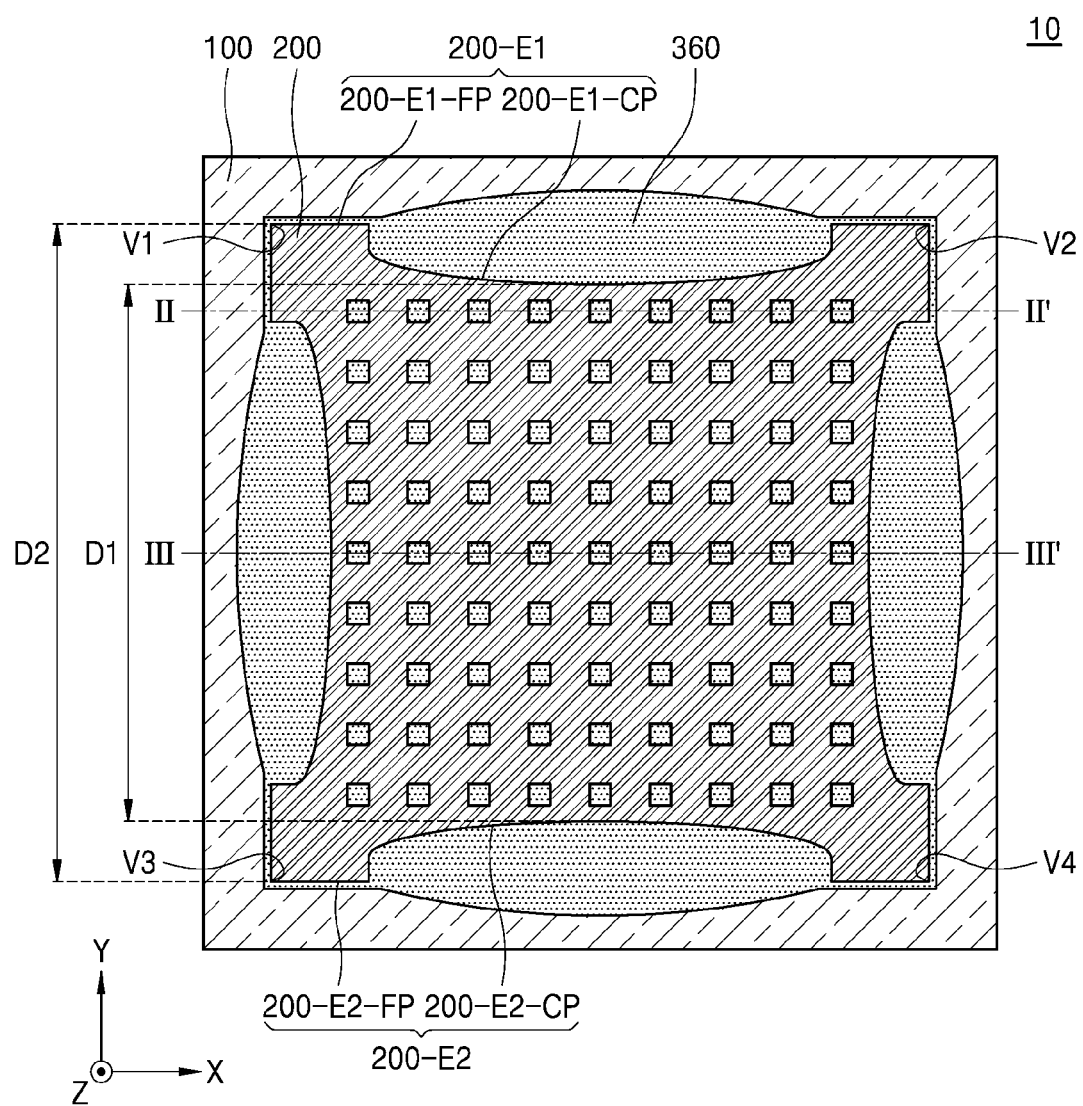
FIG. 1 is a plan view of some configuration of a semiconductor package, according to an embodiment.

Because various changes can be applied to the embodiments and accordingly, the embodiments can have various types, some embodiments are illustrated in the drawings and detailed descriptions thereof are provided. However, these are not intended to limit the embodiments to particular disclosure forms.

Figure 2:
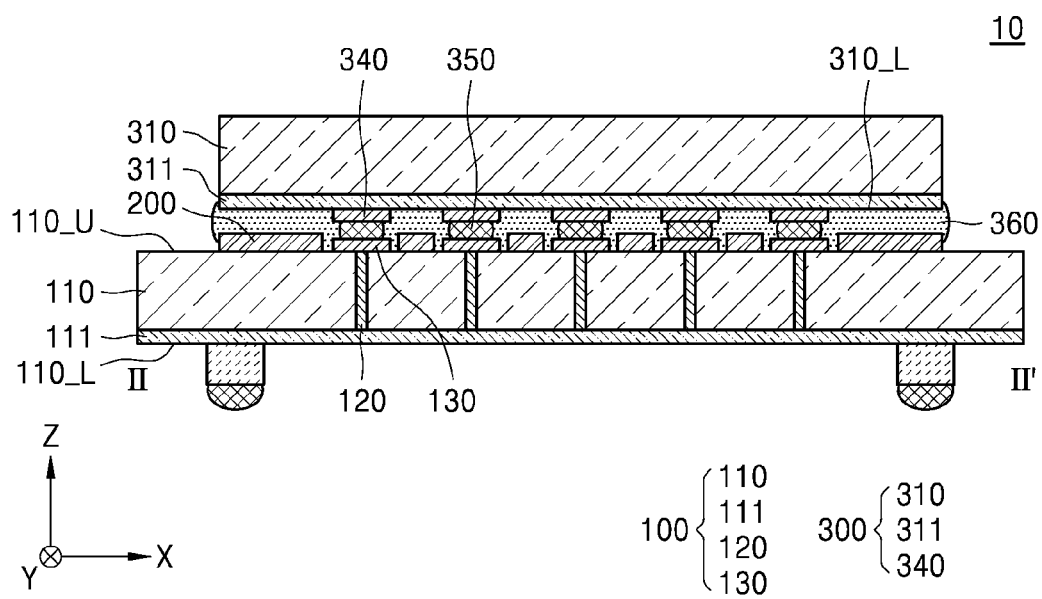
FIG. 2 is a cross-sectional view of a region taken along line II-II' in FIG. 1.
Figure 3:
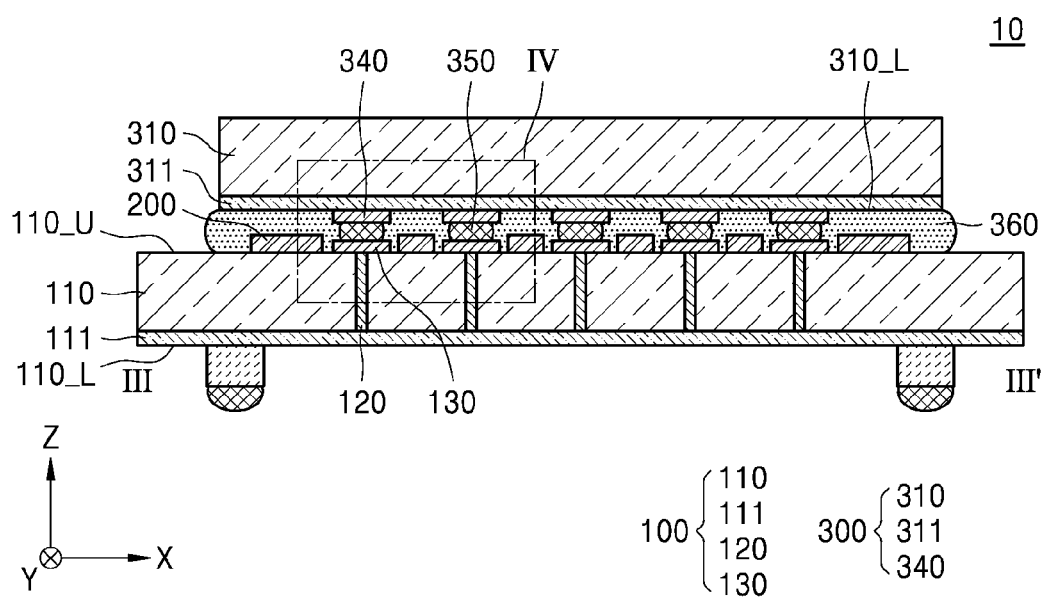
FIG. 3 is a cross-sectional view of a region taken along line in FIG. 1.
Figure 4:
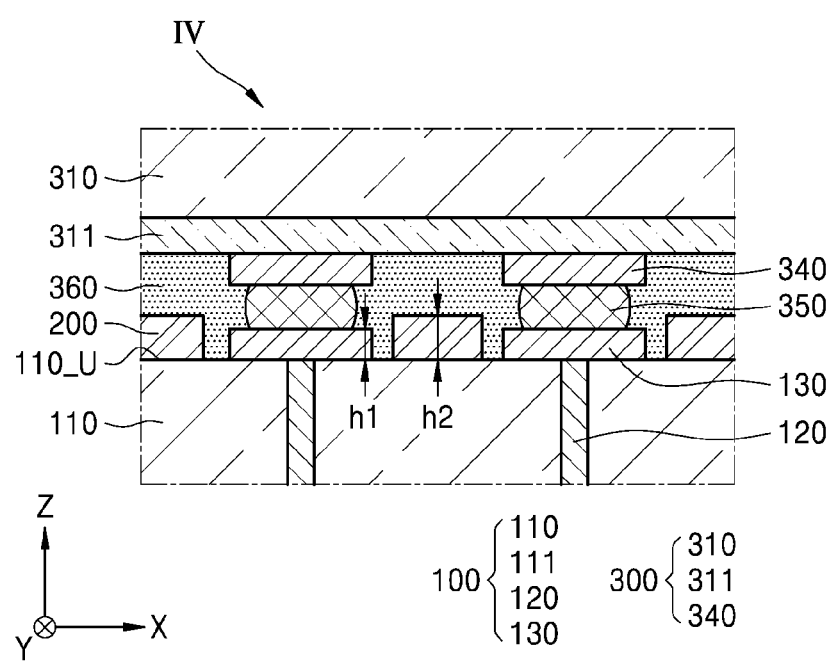
FIG. 4 is an enlarged cross-sectional view of region IV in FIG. 3.
Figure 5:
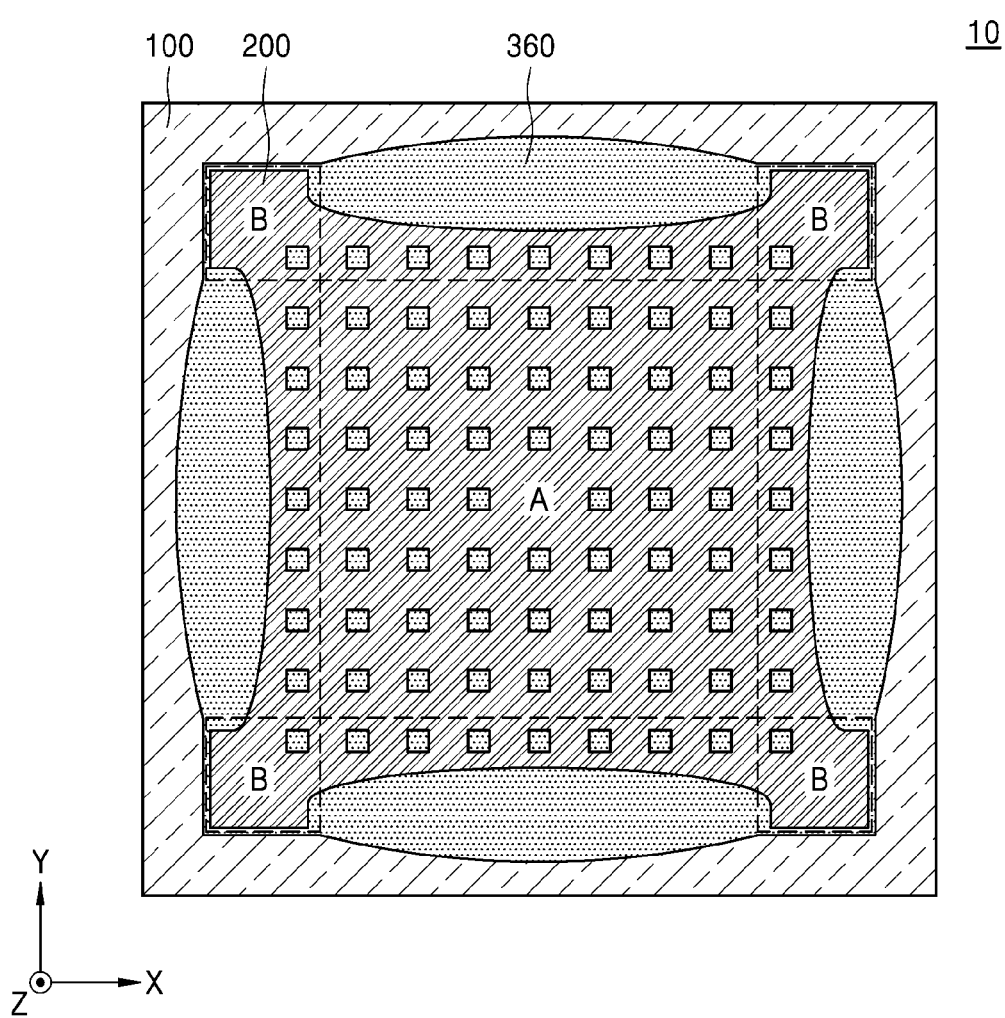
FIG. 5 is a schematic plan view of a center region and a corner region of the semiconductor package of FIG. 1.

FIG. 1 is a plan view of some configuration of a semiconductor package 10, according to an embodiment. FIG. 2 is a cross-sectional view of a region taken along line II-IF in FIG. 1. FIG. 3 is a cross-sectional view of a region taken along line in FIG. 1. FIG. 4 is an enlarged cross-sectional view of region IV in FIG. 3. FIG. 5 is an enlarged cross-sectional view of region IV in FIG. 3.

Referring to FIGS. 1 and 2, the semiconductor package 10 may include a first semiconductor chip 100, a first polymer layer 200, a second semiconductor chip 300, a first connection terminal 350, and a first adhesive layer 360.

In an embodiment, the first semiconductor chip 100 may include a memory semiconductor chip. For example, the memory semiconductor chip may include a volatile memory semiconductor chip, such as dynamic random access memory (RAM) (DRAM) and static RAM (SRAM), and a non-volatile memory semiconductor chip, such as phase change RAM (PRAM), magneto-resistive RAM (MRAM), ferroelectric RAM (FeRAM), and resistive RAM (RRAM).

However, the inventive concept is not limited thereto, and the first semiconductor chip 100 may include a logic semiconductor chip. For example, the logic semiconductor chip may include a logic semiconductor chip, such as a central processing unit (CPU), a micro processing unit (MPU), a graphics processing unit (GPU), and an application processor (AP). In addition, the first semiconductor chip 100 may include a buffer chip.

The material of a first semiconductor substrate 110 of the first semiconductor chip 100 may include silicon (Si). In addition, the material of the first semiconductor substrate 110 may also include a semiconductor element, such as germanium (Ge), and a chemical semiconductor, such as silicon carbide (SiC), gallium arsenide (GaAs), and indium phosphide (InP). However, the material of the first semiconductor substrate 110 is not limited thereto.

In an embodiment, the first semiconductor substrate 110 may include a first active layer 111 thereunder. In an embodiment, the first semiconductor substrate 110 may be provided with the first active layer 111. For example, the first active layer 111 may be formed at a lower surface 110_L of the first semiconductor substrate 110. The first active layer 111 may include a plurality of individual devices of various types. For example, the plurality of individual devices may include various micro electronic devices, for example, an image sensor, a complementary metal-oxide semiconductor (CMOS) transistor, a metal-oxide semiconductor field effect transistor (MOSFET), system large scale integration (LSI), and a CMOS imaging sensor (CIS), a micro-electro-mechanical system (MEMS), an active device, or a passive device.

The first semiconductor substrate 110 may include an upper surface 110_U and a lower surface 110_L. For example, the upper surface 110_U of the first semiconductor substrate 110 may correspond to a first surface of the first semiconductor substrate 110, on which the first upper pad 130 is arranged, and the lower surface 110_L of the first semiconductor substrate 110 may correspond a second surface, opposite to the first surface, of the first semiconductor substrate 110, on which a first lower pad is arranged or at which the first active layer 111 is formed.

Hereinafter, a horizontal direction may be defined as a direction in parallel with a direction, in which the upper surface 110_U and the lower surface 110_L of the first semiconductor substrate 110 extend, and a vertical direction may be defined as a direction perpendicular to the upper surface 110_U of the first semiconductor substrate 110 or the lower surface 110_L of the first semiconductor substrate 110.

A first through electrode 120 of the first semiconductor chip 100 may penetrate at least a portion of the first semiconductor substrate 110 in the vertical direction, and may be electrically connected to a plurality of individual devices in the first active layer 111.

For example, the first through electrode 120 may penetrate the upper surface 110_U and the lower surface 110_L of the first semiconductor substrate 110 in the vertical direction, and connect the first upper pad 130 to the first lower pad. However, the embodiment is not limited to the description above, and the first through electrode 120 may also penetrate only a portion of the first semiconductor substrate 110 in the vertical direction, and connect the first upper pad 130 to the plurality of individual devices in the first active layer 111.

In an embodiment, the first through electrode 120 may include a conductive plug (not illustrated) and a conductive barrier layer (not illustrated). The conductive plug may penetrate at least a portion of the first semiconductor substrate 110, and the conductive barrier layer may surround the sidewall of the conductive plug. For example, the conductive plug may have a circular shape, and the conductive barrier layer may have a cylindrical shape surrounding the side wall of the conductive plug.

The first upper pad 130 of the first semiconductor chip 100 may be arranged on the upper surface 110_U of the first semiconductor substrate 110, and contact the first through electrode 120. The first upper pad 130 may include a pad of a conductive material, on which the first connection terminal 350 to be described later is mounted. A vertical direction length of the first upper pad 130 may have a first thickness. The term "contact," as used herein, refers to a direct connection (i.e., touching) unless the context indicates otherwise.

In an embodiment, the materials of the first lower pad and the first upper pad 130 may include copper (Cu). However, the embodiment is not limited thereto, and the materials of the first lower pad and the first upper pad 130 may include metal, such as Ni, Cu, Au, Ag, W, Ti, Ta, In, Mo, Mn, Co, Sn, Mg, Re, Be, Ga, Ru, and an alloy thereof.

The first polymer layer 200 may be arranged on the upper surface 110_U of the first semiconductor substrate 110. The first polymer layer 200 may include a hole for accommodating the first upper pad 130 of the first semiconductor substrate 110. The first polymer layer 200 is described below with reference to FIGS. 2 through 4.

The second semiconductor chip 300 may include a semiconductor chip to be mounted on the first semiconductor chip 100. In an embodiment, the second semiconductor chip 300 may include a second lower pad 340 and a second semiconductor substrate 310 provided with a second active layer 311. Hereinafter, duplicate descriptions of the first semiconductor chip 100 and the second semiconductor chip 300 are omitted, and differences thereof are mainly described.

In an embodiment, the first semiconductor chip 100 and the second semiconductor chip 300 may include semiconductor chips of different types. Accordingly, the semiconductor package 10 may include a system in package (SIP), in which the first and second semiconductor chips 100 and 300 of different types are electrically connected with each other, and operate as one system. However, the embodiment is not limited thereto, and the first and second semiconductor chips 100 and 300 may also include semiconductor chips of the same type.

In an embodiment, the second semiconductor chip 300 may include a memory semiconductor chip. However, the embodiment is not limited thereto, and the second semiconductor chip 300 may include a logic semiconductor chip.

In an embodiment, the second semiconductor substrate 310 may include the second active layer 311 thereunder. In an embodiment, the second semiconductor substrate 310 may be provided with the second active layer 311. For example, the second active layer 311 may be formed at a surface of the second semiconductor substrate 310. The second active layer 311 may include a plurality of individual devices of different types.

Figure 9:
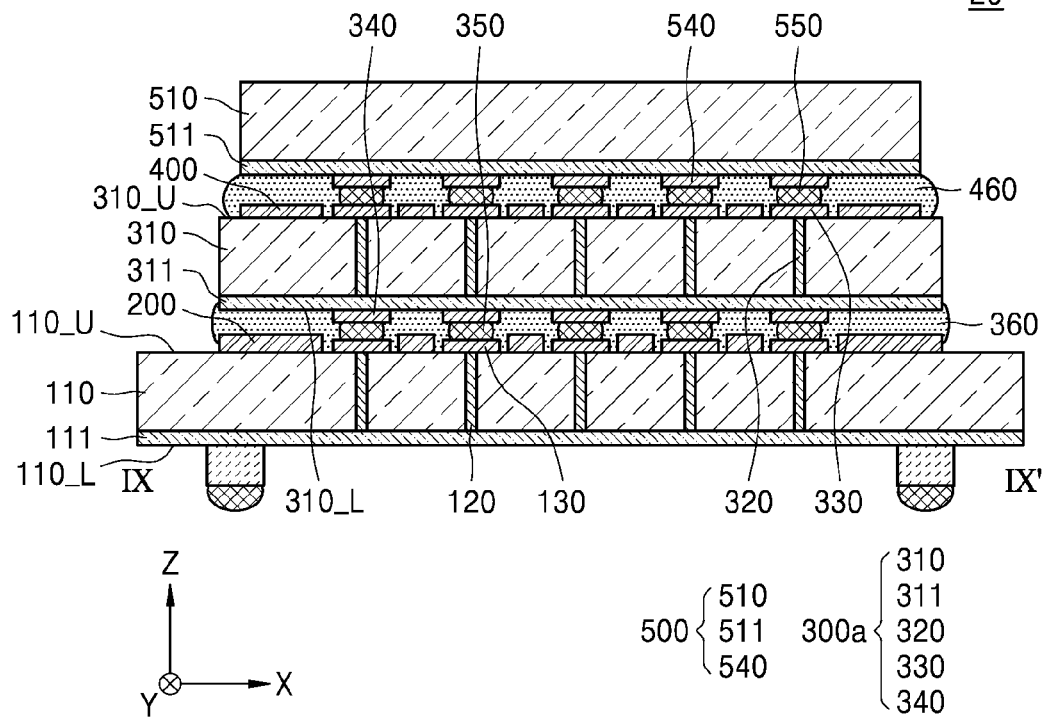
FIG. 9 is a cross-sectional view of a region taken along line IX-IX' in FIG. 8.

In addition, the second semiconductor substrate 310 may include an upper surface 310_U and a lower surface 310_L (refer to FIG. 9). For example, the lower surface 310_L of the second semiconductor substrate 310 may be one surface of the second semiconductor substrate 310, on which the second lower pad 340 is arranged.

The second lower pad 340 of the second semiconductor chip 300 may be arranged on the lower surface 310_L of the second semiconductor substrate 310, and may be electrically connected to a plurality of individual devices in the second active layer 311.

In an embodiment, a vertical direction length of the second lower pad 340 may be about 10 micrometers to about 100 micrometers. However, the vertical direction length of the second lower pad 340 is not limited thereto.

In an embodiment, the second semiconductor chip 300 may further include a second passivation layer (not illustrated) of an insulating material, which is arranged on the lower surface 310_L of the second semiconductor substrate 310 and surrounds the sides of the second lower pad 340. The second passivation layer may expose a lower surface of the second lower pad 340.

In an embodiment, the material of the second lower pad 340 may include copper (Cu). However, the embodiment is not limited thereto, and the material of the second lower pad 340 may include metal, such as Ni, Cu, Au, Ag, W, Ti, Ta, In, Mo, Mn, Co, Sn, Mg, Re, Be, Ga, and Ru, and an alloy thereof.

The first connection terminal 350 of the semiconductor package 10 may be arranged between the first upper pad 130 of the first semiconductor chip 100 and the second lower pad 340 of the second semiconductor chip 300, and electrically connect the first semiconductor chip 100 to the second semiconductor chip 300.

In an embodiment, the first connection terminal 350 may include a solder ball of a metal material including at least one of Sn, Ag, Cu, and Al.

The first adhesive layer 360 of the semiconductor package 10 may be arranged between the first semiconductor chip 100 and the second semiconductor chip 300, and surround each of the first upper pad 130, the second lower pad 340, and the first connection terminal 350.

In an embodiment, the material of the first adhesive layer 360 may include at least one of a non-conductive film (NCF), a non-conductive paste (NCP), an insulating polymer layer, and an epoxy resin.

In an embodiment, the first adhesive layer 360 may be arranged between the first semiconductor chip 100 and the second semiconductor chip 300. In the process of mounting the second semiconductor chip 300 on the upper portion of the first semiconductor chip 100, the first adhesive layer 360 may protrude outwardly from the central region of the second semiconductor chip 300. For example, the first adhesive layer 360 may overflow outwardly from the central portion of the second semiconductor chip 300. For example, the first adhesive layer 360 may extend outwardly beyond a side surface of the second semiconductor chip 300. In addition, as the thickness of the first adhesive layer 360 decreases, the first adhesive layer 360 may not completely fill spaces between the second semiconductor chip 300 and the first semiconductor chip 100. For example, spaces between the corner regions of the second semiconductor chip 300 and the second semiconductor chip 300 may not be completely filled with the first adhesive layer 360. This issue of the overflowing or insufficient filling is described in detail below with reference to FIGS. 7 and 8.

The first polymer layer 200 may have a horizontal width, in a direction crossing the first polymer layer 200 in the center region of the second semiconductor chip 300, as a first length D1, and may have a horizontal width in a direction crossing two corner regions of the first polymer layer 200 in the corner regions of the second semiconductor chip 300, as a second length D2. The second length D2 may be greater than the first length D1.

The first polymer layer 200 may include a concave portion at an end portion of the first polymer layer 200 extending from each side of the center region of the second semiconductor chip 300. The first adhesive layer 360 may fill the concave portion of the first polymer layer 200. In other words, the first polymer layer 200 may include a concave portion facing inwardly on a sidewall between the corner regions of the second semiconductor chip 300. In other words, the first polymer layer 200 may include a concave portion at end portions of the first polymer layer 200, except for the corner regions of the second semiconductor chip 300. In some embodiments, the first polymer layer 200 has a first edge 200-E1 connecting a first vertex V1 to a second vertex V2 and having a first flat portion 200-E1-FP and a first curved portion 200-E1-CP, and a second edge 200-E2 connecting a third vertex V3 to a fourth vertex V4 and having a second flat portion 200-E2-FP and a second curved portion 200-E2-CP. The first curved portion 200-E1-CP may be located at a center of the first edge 200-E1 and the first flat portion 200-E1-FP may connect the first vertex V1 to the first curved portion 200-E1-CP. The second curved portion 200-E2-CP may be at a center of the second edge 200-E2 and the second flat portion 200-E2-FP may connect the third vertex V3 to the second curved portion 200-E2-CP. The first vertex V1 and the third vertex V3 may be arranged at a first line extending in a direction of Y axis (a first direction). The first vertex V1 and the second vertex V2 may be arranged at a second line extending in a direction of X axis (a second direction) different from the first direction. The first curved portion 200-E1-CP and the second curved portion 200-E2-CP may be spaced apart from each other at a first length D1 measured in the first direction. The first flat portion 200-E1-FP and the second flat portion 200-E2-FP may be spaced apart from each other at a second length D2 measured in the first direction. The second length D2 may be greater than the first length D1.

When the second semiconductor chip 300 is mounted on the first semiconductor chip 100, the first adhesive layer 360 may be evenly formed between the first semiconductor chip 100 and the second semiconductor chip 300, even when the first adhesive layer 360 is thinned by using a double gap filling material, which uses the first adhesive layer 360 and the first polymer layer 200.

Referring to FIGS. 2 and 3, the second length D2 of the first polymer layer 200 may be the same as the length between both ends of the second semiconductor chip 300. In some embodiments, the second length D2 of the first polymer layer 200 may be about 100% to about 120% of the length between both ends of the second semiconductor chip 300. The first polymer layer 200 has a wide horizontal pattern in the corner regions of the second semiconductor chip 300, and accordingly, may prevent insufficient filling of the first adhesive layer 360 in spaces between the first semiconductor chip 100 and the corner regions of the second semiconductor chip 300. With the presence of the first polymer layer 200 under the corner regions of the second semiconductor chip 300, it may be secured that the first adhesive layer 360 with a reduced thickness may fill the spaces below the corner regions of the second semiconductor chip 300.

Referring to FIGS. 2 and 4, the first length D1 of the first polymer layer 200 may be less than the length between opposite ends (i.e., opposite sides) of the second semiconductor chip 300. In some embodiments, the first length D1 of the first polymer layer 200 may be about 60% to about 90% of the length between opposite ends of the second semiconductor chip 300. The first polymer layer 200 may have a pattern having a narrow horizontal width in the center region of the second semiconductor chip 300, and thus, may suppress a fillet phenomenon of the first adhesive layer 360.

In a semiconductor package, in which semiconductor chips are vertically stacked, a fillet phenomenon, in which an adhesive layer overflows from the center region of a semiconductor chip to the outside of the stacked semiconductor chip, may occur. When the thickness of the adhesive layer of the stacked semiconductor package is reduced, there is an issue that the adhesive layer becomes insufficient at the corner regions of the semiconductor chip. In the case of the semiconductor package 10 of the inventive concept, by using the first polymer layer 200, which has different horizontal widths in the center region and in the corner regions of the second semiconductor chip 300, as a gap filling material, the fillet phenomenon of the first adhesive layer 360 may be suppressed, and a coverage deficiency phenomenon may be prevented. For example, the first polymer layer 200 may serve as a gap filling material filling a space between the second semiconductor chip 300 and the first semiconductor chip 100, and may have an edge with a concave portion between two corners connected by the edge to suppress the fillet phenomenon of the first adhesive layer 360 and to avoid insufficient filling thereof in spaces under the corner regions of the second semiconductor chip 300.

Referring to FIGS. 1 and 4, the vertical direction length of the first polymer layer 200 may have a second thickness h2. The second thickness h2 of the first polymer layer 200 may be different from the first thickness h1 of the first upper pad 130 of the first semiconductor chip 100. The second thickness h2 of the first polymer layer 200 may be greater than the first thickness h1 of the first upper pad 130 of the first semiconductor chip 100. In some embodiments, the second thickness h2 of the first polymer layer 200 may be about 100% to about 180% of the first thickness h1 of the first upper pad 130 of the first semiconductor chip 100.

In the case of a semiconductor package, in which semiconductor chips are vertically stacked, the fillet phenomenon and the coverage quality deterioration of an upper adhesive layer of the semiconductor chip on a first floor may be a more serious issue than those of the semiconductor chips stacked on floors higher than the first floor. In the case of the semiconductor package 10 of the inventive concept, by using the thick first polymer layer 200 on the first semiconductor chip 100 on the first floor, the fillet phenomenon of the first adhesive layer 360 may be suppressed and the coverage quality deterioration may be prevented.

Figure 6:
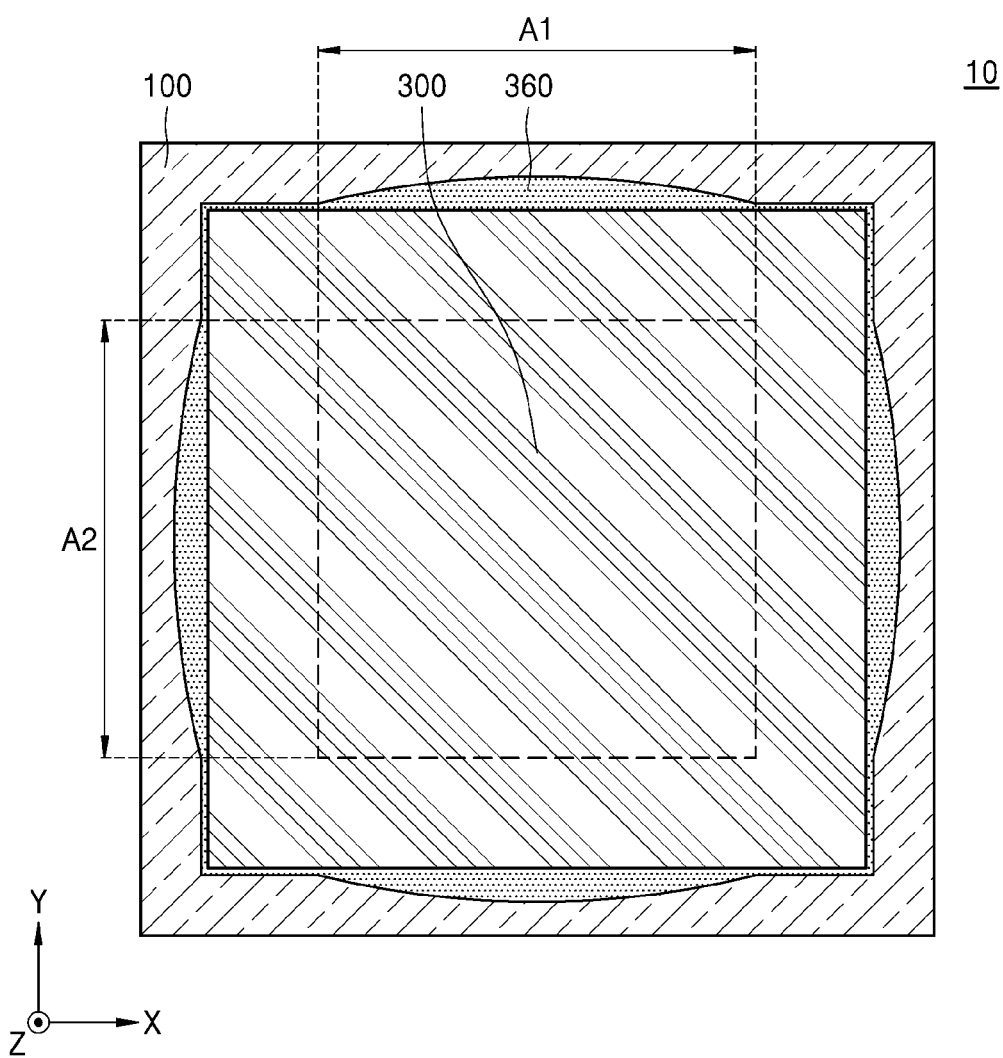
FIGS. 6 and 7 are schematic plan views of a semiconductor package, according to embodiments.
Figure 7:
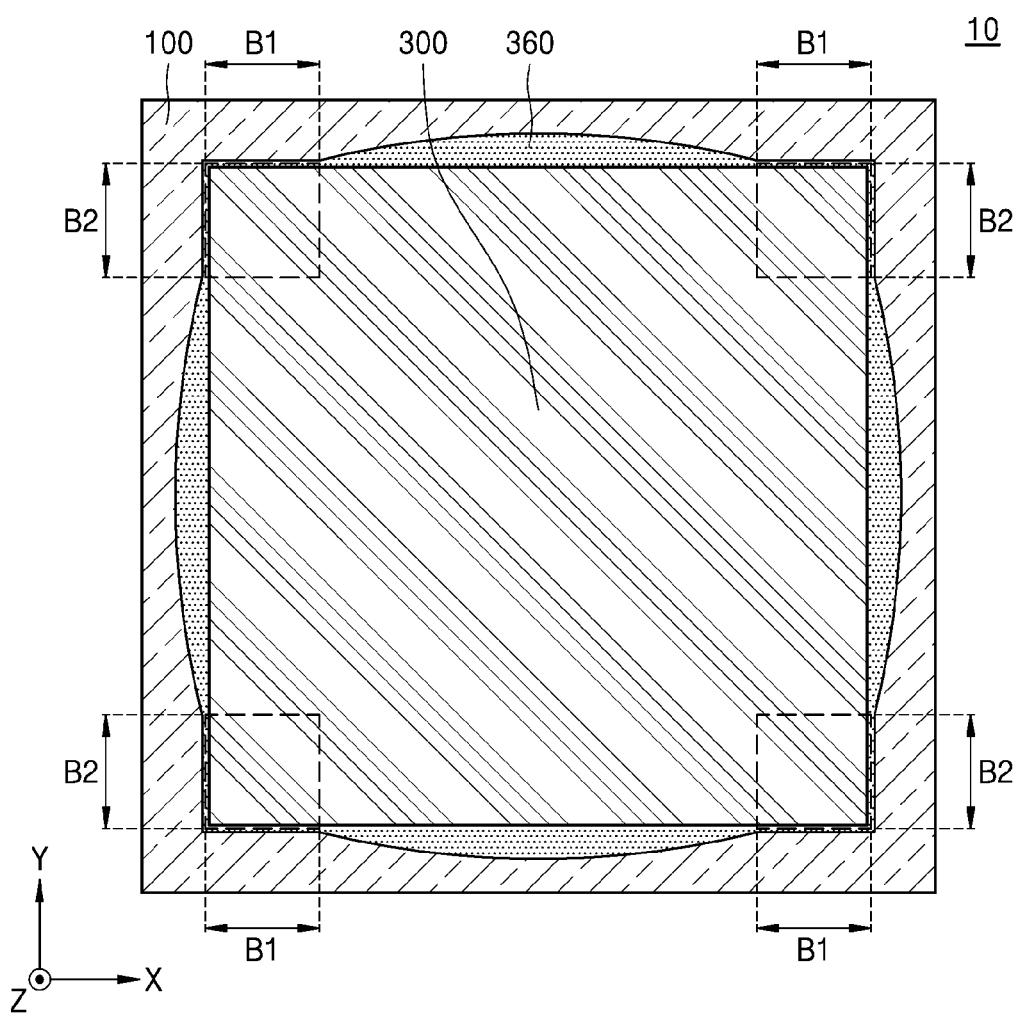

FIG. 5 is a schematic plan view of a center region A and a corner region B of the semiconductor package 10 of FIG. 1. FIGS. 6 and 7 are schematic plan views of the semiconductor package 10, according to embodiments.

Referring to FIGS. 2 and 5, in the process of thermally bonding the second semiconductor chip 300 onto the first semiconductor chip 100, the fillet phenomenon, in which the first adhesive layer 360 protrudes to the outside of the second semiconductor chip 300, may occur. The center region A of the second semiconductor chip 300 may include a region, in which the fillet phenomenon occurs in a general semiconductor package. In some embodiments, the center region A of the second semiconductor chip 300 may include a center point of the lower surface 310_L of the second semiconductor substrate 310.

In the process of thermally bonding the second semiconductor chip 300 onto the first semiconductor chip 100, when the first adhesive layer 360 becomes thin, a phenomenon, in which an adhesive layer insufficiently fills spaces between the semiconductor chips, may occur, and thus, the coverage quality deterioration may occur. The corner region B of the second semiconductor chip 300 may include a region, in which an adhesive layer does not completely fill spaces between the semiconductor chips in the general semiconductor package. In some embodiments, the corner region B of the second semiconductor chip 300 may include a vertex point of the lower surface 310_L of the second semiconductor substrate 310.

Referring to FIGS. 2 and 6, the center point of the center region (A in FIG. 5) of the second semiconductor chip 300 may coincide with the center point of the lower surface 310_L of the second semiconductor substrate 310. The center region (A in FIG. 5) of the second semiconductor chip 300 may have a horizontal length A1 of about 60% to about 80% of the horizontal length of the second semiconductor chip 300, and a longitudinal length A2 of about % to about 80% of the longitudinal length of the second semiconductor chip 300.

In some embodiments, the center region (A in FIG. 5) of the second semiconductor chip 300 may include a center horizontal region and a center longitudinal region. In some embodiments, the center horizontal region may include a horizontal axis passing through the center point of the lower surface 310_L of the second semiconductor substrate 310. The center horizontal region may include a region, which is about 60% to about 80% of the area of the lower surface 310_L of the second semiconductor substrate 310 symmetrical with respect to the horizontal axis. In some embodiments, the center vertical region may include a vertical axis passing through the center point of the lower surface 310_L of the second semiconductor substrate 310. The center vertical region may be a region, which is about 60% to about 80% of the area of the lower surface 310_L of the second semiconductor substrate 310 symmetrical with respect to the vertical axis.

Referring to FIGS. 3, 5, and 7, the corner region B of the second semiconductor chip 300 may include a region near the vertex point of the lower surface 310_L of the second semiconductor substrate 310. In some embodiments, the corner region B of the second semiconductor chip 300 may include all the vertex points of the lower surface 310_L of the second semiconductor substrate 310. The corner region B of the second semiconductor chip 300 may, at each vertex point, have a horizontal length B1 of about 10% to about 20% of the horizontal length of the lower surface 310_L of the second semiconductor substrate 310, and a longitudinal length B2 of about 10% to about 20% of the longitudinal length of the lower surface 310_L of the second semiconductor substrate 310.

Figure 8:
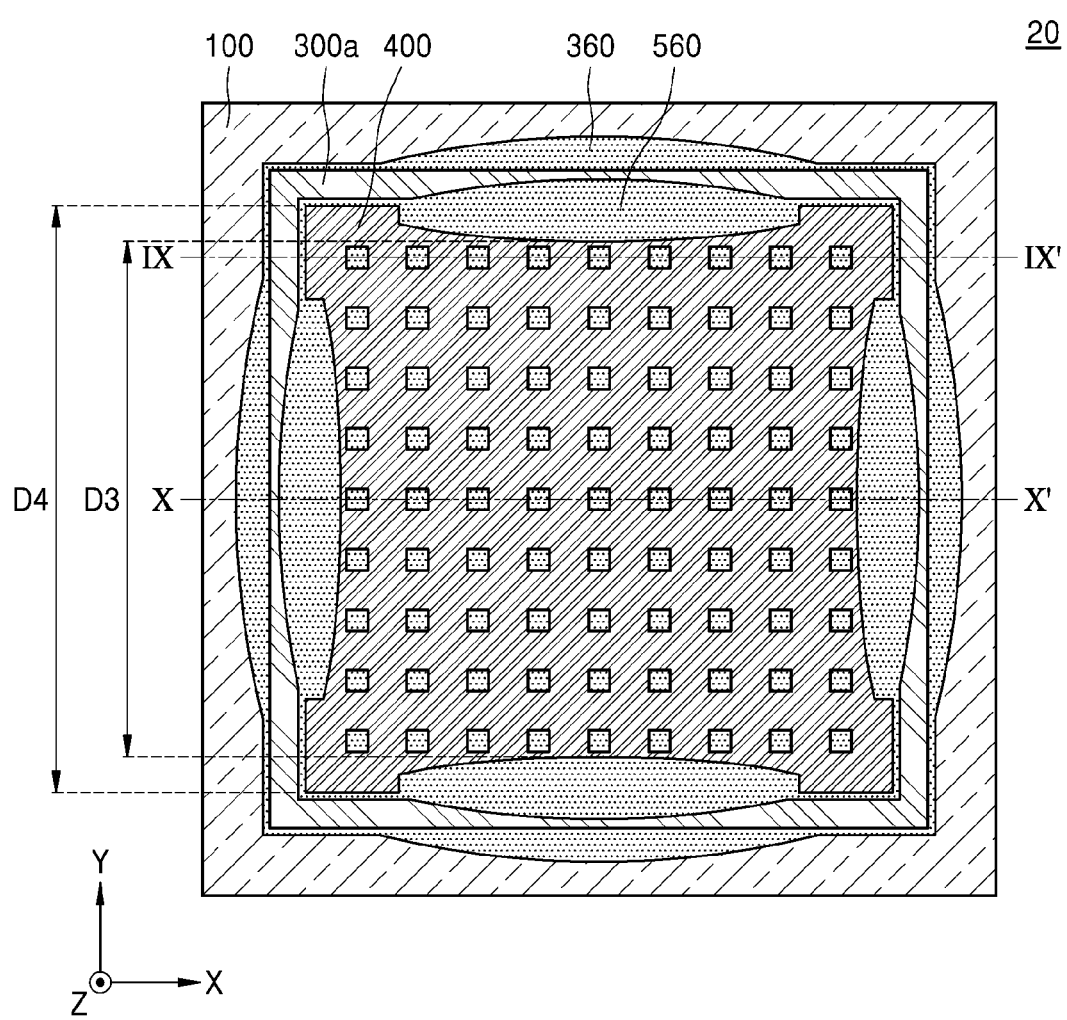
FIG. 8 is a plan view of some configuration of a semiconductor package, according to an embodiment.
Figure 10:
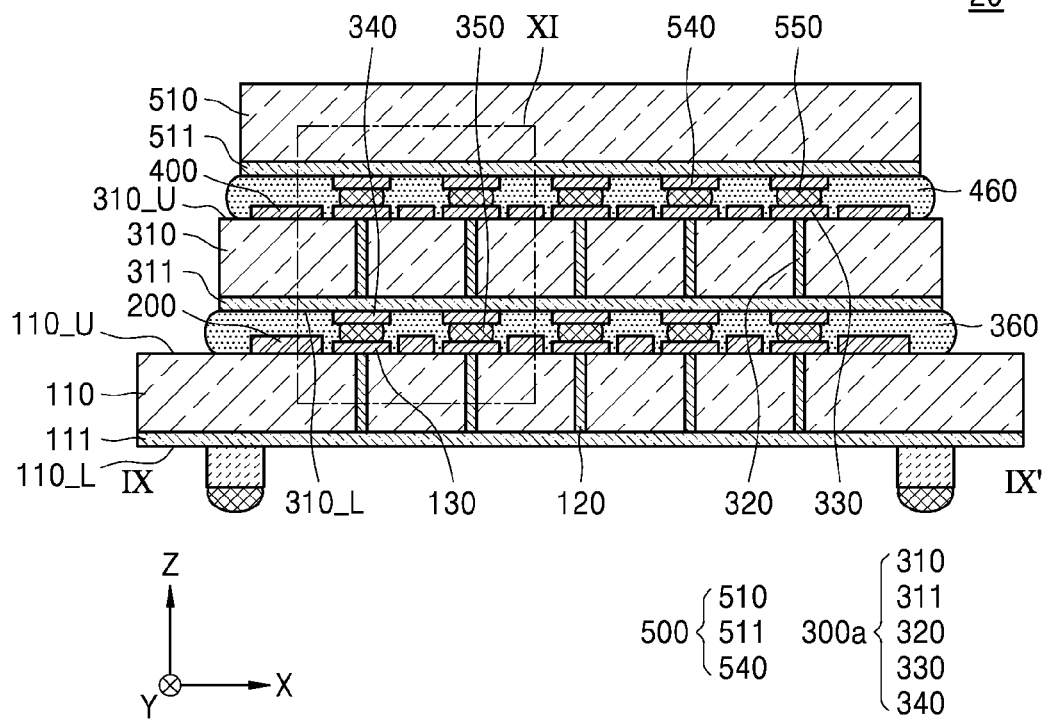
FIG. 10 is a cross-sectional view of a region taken along line X-X' in FIG. 8.
Figure 11:
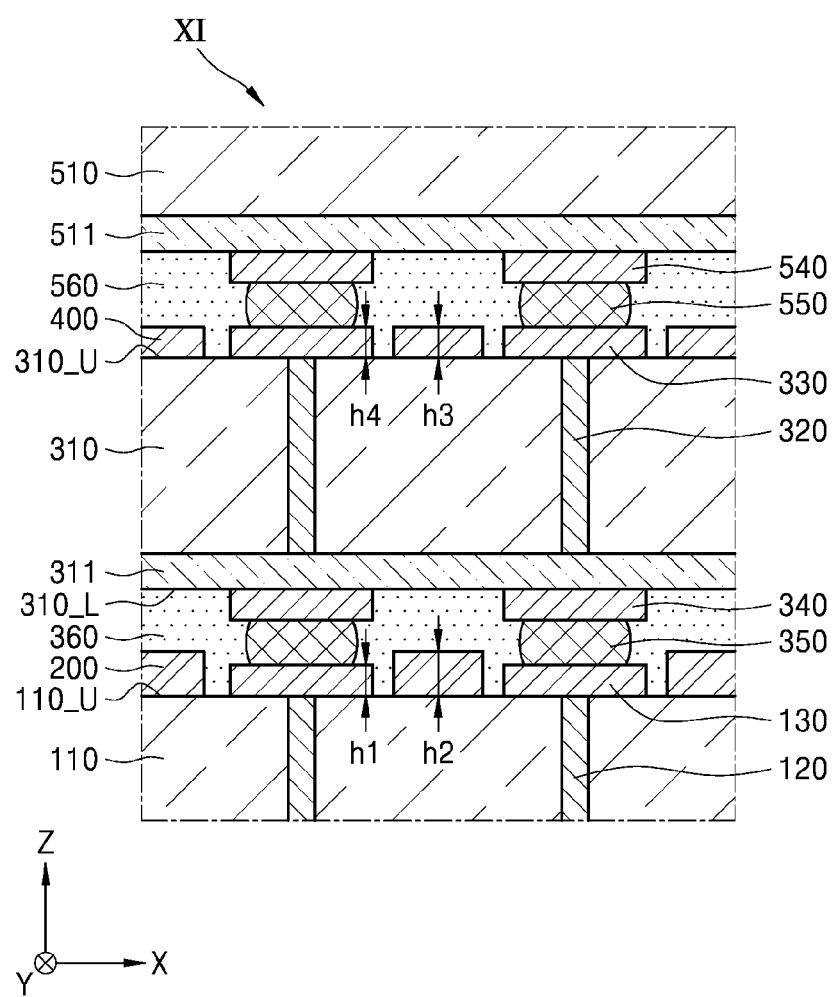
FIG. 11 is an enlarged view of region XI' in FIG. 10.

FIG. 8 is a plan view of some configuration of a semiconductor package 20, according to an embodiment. FIG. 9 is a cross-sectional view of a region designated as IX-IX' in FIG. 8. FIG. 10 is a cross-sectional view of a region designated as X-X' in FIG. 8. FIG. 11 is an enlarged view of a region designated as XI in FIG. 10.

Referring to FIGS. 8 and 9, the semiconductor package 20 may include the first semiconductor chip 100, the first polymer layer 200, a second semiconductor chip 300a, a second polymer layer 400, a third semiconductor chip 500, a second connection terminal 550, the first adhesive layer 360, and a second adhesive layer 560. FIG. 8 is a plan view of the semiconductor package 20 under an assumption that the third semiconductor chip 500 is transparent. In some embodiments, the semiconductor package 20 may further include a sealing material (not illustrated) for sealing the first semiconductor chip 100, the second semiconductor chip 300a, and the third semiconductor chip 500. Hereinafter, duplicate descriptions previously given above are omitted, and differences thereof are mainly described.

The first semiconductor chip 100 may include the first semiconductor substrate 110, a first through electrode 120, and a first upper pad 130. The vertical direction length of the first upper pad 130 of the first semiconductor chip 100 may be the first thickness (h1 in FIG. 11).

The first polymer layer 200 may be arranged on the upper surface 110_U of the first semiconductor substrate 110 of the first semiconductor chip 100. The first polymer layer 200 may include a hole for accommodating the first upper pad 130 of the first semiconductor chip 100. The vertical direction length of the first polymer layer 200 may be the second thickness h2. The length between opposite ends in the center region of the second semiconductor chip 300a of the first polymer layer 200 may be the first length (D1 in FIG. 1). The length between opposite ends in the corner region of the second semiconductor chip 300a of the first polymer layer 200 may be the second length (D2 in FIG. 1).

The second semiconductor chip 300a may be mounted on the first semiconductor chip 100. The second semiconductor chip 300a may include the second semiconductor substrate 310, a second through electrode 320, the second lower pad 340, and a second upper pad 330. The vertical direction length of the second upper pad 330 may have a third thickness (h3 in FIG. 11).

The second polymer layer 400 may be arranged on the upper surface 310_U of the second semiconductor substrate 310 of the second semiconductor chip 300a. The second polymer layer 400 may include a hole for accommodating the second upper pad 330 of the second semiconductor chip 300a. The vertical direction length of the second polymer layer 400 may be a fourth thickness h4. The second polymer layer 400 may have a horizontal width in a direction crossing the second polymer layer 400 in the center region of the third semiconductor chip 500, as a third length D3. The second polymer layer 400 may have a horizontal width in a direction crossing two corner regions of the second polymer layer 400 from the corner region of the third semiconductor chip 500, as a fourth length D4 greater than the third length D3. This issue is described in detail below with reference to FIGS. 10 through 12.

The third semiconductor chip 500 may be mounted on the second semiconductor chip 300a. The third semiconductor chip 500 may include a third semiconductor substrate 510 and a third lower pad 540.

The first connection terminal 350 may be arranged between the first upper pad 130 of the first semiconductor chip 100 and the second lower pad 340 of the second semiconductor chip 300a. The second connection terminal 550 may be arranged between the second upper pad 330 of the second semiconductor chip 300a and the third lower pad 540 of the third semiconductor chip 500.

The first adhesive layer 360 may be arranged between the first semiconductor chip 100 and the second semiconductor chip 300a. The first adhesive layer 360 may surround each of the first upper pad 130, the second lower pad 340, and the first connection terminal 350.

The second adhesive layer 560 may be arranged between the second semiconductor chip 300a and the third semiconductor chip 500. The second adhesive layer 560 may surround each of the second upper pad 330, the third lower pad 540, and the second connection terminal 550. In an embodiment, the material of the second adhesive layer 560 may include at least one of a non-conductive film (NCF), a non-conductive paste (NCP), insulating polymer, and an epoxy resin.

When the third semiconductor chip 500 is mounted on the second semiconductor chip 300a, even when the second adhesive layer 560 become thin, by using a double gap filling, which uses the second adhesive layer 560 and the second polymer layer 400, the second adhesive layer 560 may be uniformly formed between the second semiconductor chip 300a and the third semiconductor chip 500.

Referring to FIGS. 8 and 9, the fourth length D4 of the second polymer layer 400 may be the same as the length between opposite ends of the third semiconductor chip 500. In some embodiments, the fourth length D4 of the second polymer layer 400 may be about 100% to about 120% of the length between opposite ends of the third semiconductor chip 500. Because the second polymer layer 400 has a wide horizontal pattern in the corner regions of the third semiconductor chip 500, a phenomenon, in which the second adhesive layer 560 does not fill completely the corner regions of the third semiconductor chip 500, may be prevented.

Referring to FIGS. 8 and 10, the third length D3 of the second polymer layer 400 may be less than the length between opposite ends of the third semiconductor chip 500. In some embodiments, the third length D3 of the second polymer layer 400 may be about 60% to about % of the length between opposite ends of the third semiconductor chip 500. The second polymer layer 400 may have a narrow horizontal pattern in the center region of the third semiconductor chip 500, and thus, the fillet phenomenon of the second adhesive layer 560 may be prevented.

Referring to FIGS. 8, 10, and 11, the vertical direction length of the first polymer layer 200 may be the second thickness h2. The second thickness h2 of the first polymer layer 200 may be different from the first thickness h1 of the first upper pad 130 of the first semiconductor chip 100. The second thickness h2 of the first polymer layer 200 may be greater than the first thickness h1 of the first upper pad 130 of the first semiconductor chip 100. In some embodiments, the second thickness h2 of the first polymer layer 200 may be about 100% to about 180% of the first thickness h1 of the first upper pad 130 of the first semiconductor chip 100.

The vertical direction length of the second polymer layer 400 may be the fourth thickness h4. The fourth thickness h4 of the second polymer layer 400 may be less than the third thickness h3 of the second upper pad 330 of the second semiconductor chip 300a. In some embodiments, the fourth thickness h4 of the second polymer layer 400 may be less than the third thickness h3 of the second upper pad 330 of the second semiconductor chip 300a. In some embodiments, the fourth thickness h4 of the second polymer layer 400 may be about 60% to about 100% of the third thickness h3 of the second upper pad 330 of the second semiconductor chip 300a.

Figure 12:
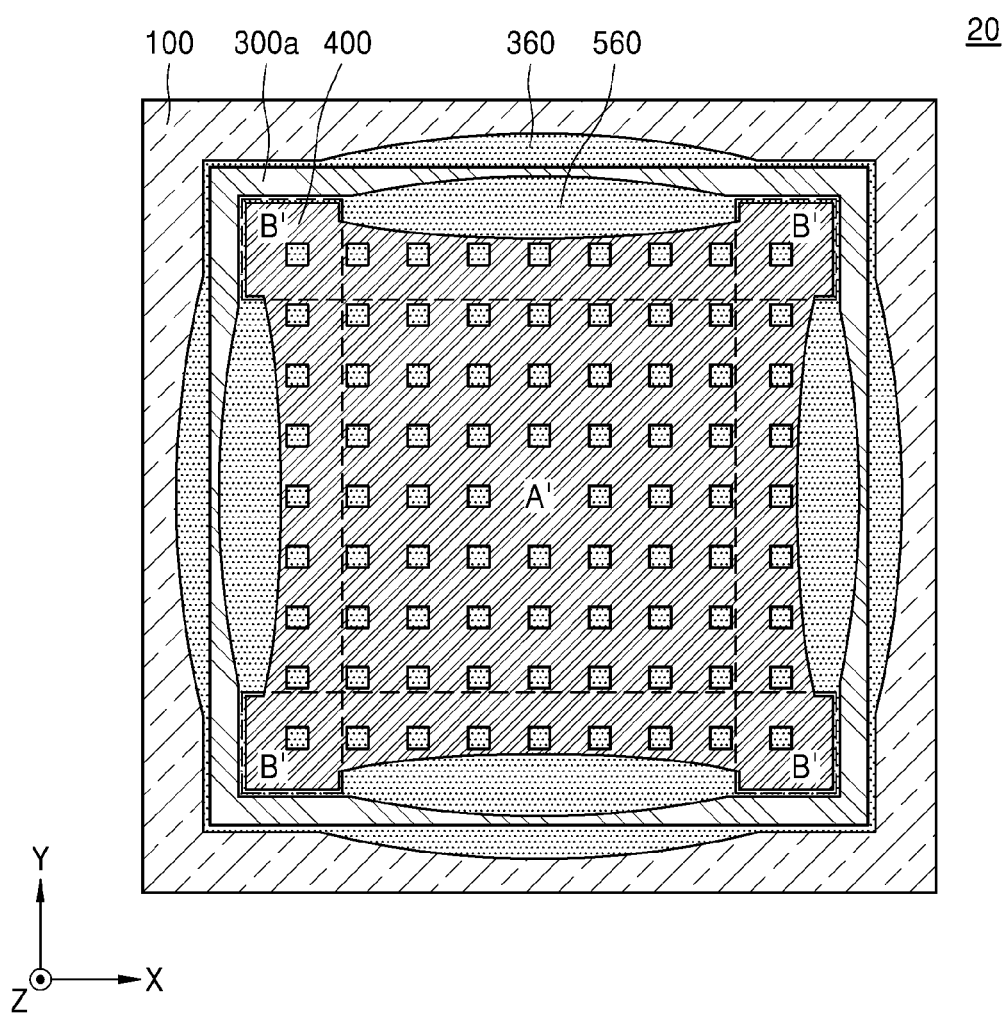
FIG. 12 is a plan view of some configuration of a semiconductor package, according to an embodiment.

FIG. 12 is a plan view of some configuration of the semiconductor package 20, according to an embodiment.

Referring to FIGS. 8 and 12, in the process of thermally bonding the third semiconductor chip 500 onto the second semiconductor chip 300a, the fillet phenomenon, in which the second adhesive layer 560 overflows to the outside of the third semiconductor chip 500, may occur. A center region A' of the third semiconductor chip 500 may include a region, in which the fillet phenomenon occurs in a general semiconductor package. In some embodiments, the center region A' of the third semiconductor chip 500 may include a center point of a lower surface 510_L of the third semiconductor substrate 510.

In the process of thermally bonding the third semiconductor chip 500 onto the second semiconductor chip 300a, when the second adhesive layer 560 becomes thin, an adhesive layer may not sufficiently fill spaces between the semiconductor chips, and thus, the coverage quality deterioration may occur. A corner region B' of the third semiconductor chip 500 may include a region, in which an adhesive layer does not completely fill spaces between the semiconductor chips in the general semiconductor package. In some embodiments, the corner region B' of the third semiconductor chip 500 may include a vertex point of the lower surface 510_L of the third semi conductor substrate 510.

FIGS. 13 through 25 are cross-sectional views illustrating a fabrication method of a semiconductor package according to a process sequence.

FIGS. 13 through 16 illustrate processes of forming the first semiconductor chip 100 and the first polymer layer 200.

Figure 13:
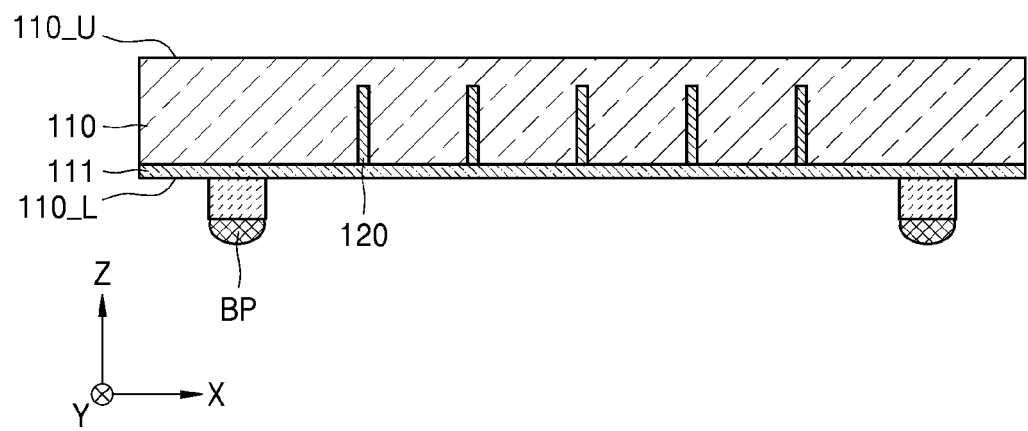
FIGS. 13 through 25 are cross-sectional views illustrating a fabrication method of a semiconductor package according to a process sequence.

FIG. 13 illustrates an operation of forming a bump BP on the first semiconductor substrate 110 provided with the first active layer 111 and the first through electrode 120. In some embodiments, a passivation open process may be performed on portions of the first active layer 111, where function and thermal bumps are arranged. After the passivation open process is performed, the bump forming process may be performed. The passivation open process may include a photo process, a passivation etching process, and a strip process. The bump forming process may include a photo process, an electro plating (EP) process, a strip process, and a metal etching process.

Figure 14:
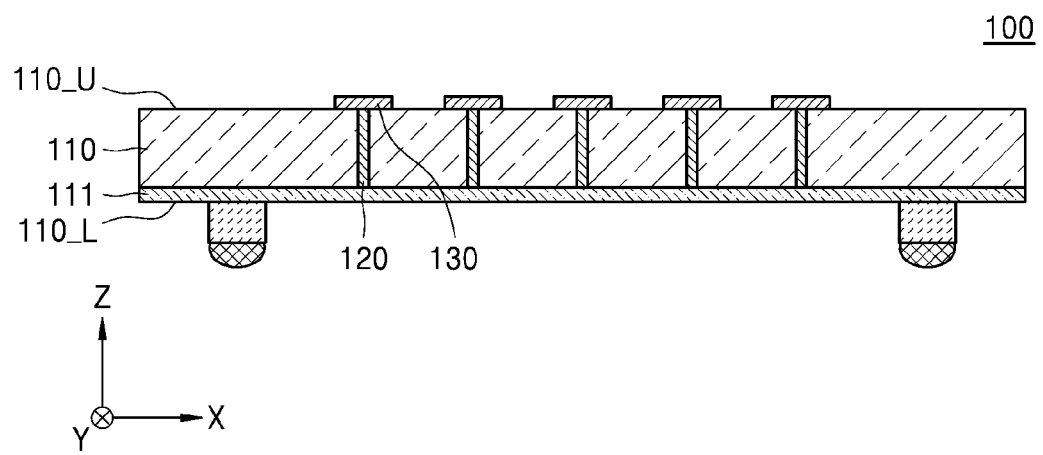

FIG. 14 illustrates an operation of exposing the first through electrode 120 at the upper surface of the first semiconductor substrate 110, and forming the first upper pad 130. In some embodiments, to expose the first through electrode 120 to the outside, a thinning process (for example, a chemical mechanical polishing process (CMP)) may be performed on the first semiconductor substrate 110. The thinning process may include a carrier attachment process, a polishing process, and a dry etching process. In some embodiments, the process of forming the first upper pad 130 may include a photo process, an EP process, a strip process, and a metal etching process.

Figure 15:
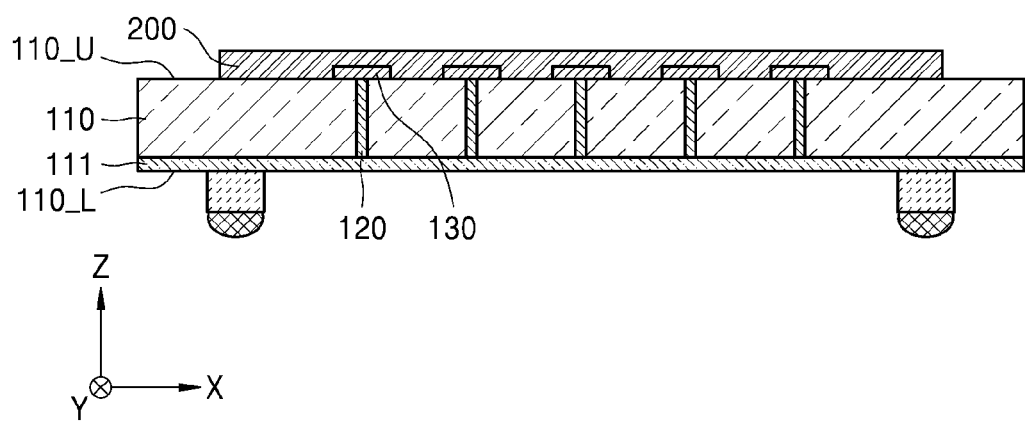
Figure 16:
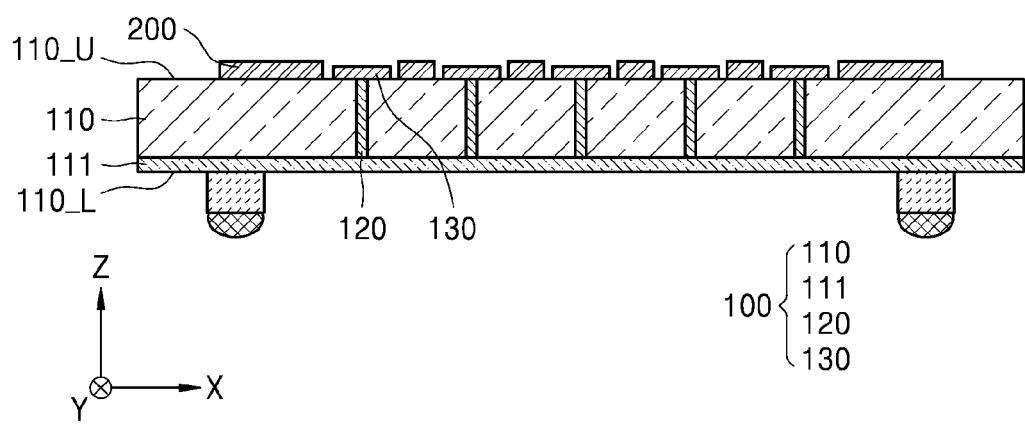

FIGS. 15 and 16 illustrate operations of forming the first polymer layer 200. In some embodiments, a photosensitive polymer layer may be coated on the upper surface 110_U of the first semiconductor substrate 110. In some embodiments, a thickness of the first polymer layer 200 may be greater than a thickness of the first upper pad 130 of the first semiconductor chip 100.

Thereafter, a process of forming a pattern having different widths may be performed on the photosensitive polymer. The process of fabricating the pattern may include an exposure process, a development process, and a cure process. In other words, the first polymer layer 200 may be formed by performing a patterning process on a photosensitive polymer layer. In some embodiments, the pattern may be a pattern, which has the first length D1 in the center region of a second semiconductor chip, and the second length D2, greater than the first length D1, in the corner regions of the second semiconductor chip.

FIGS. 17 through 21 illustrate processes of forming the second semiconductor chip 300a and the second polymer layer 400 of FIG. 8. Hereinafter, duplicate descriptions of the first semiconductor chip 100 and the second semiconductor chip 300a are omitted, and differences thereof are mainly described.

Figure 17:
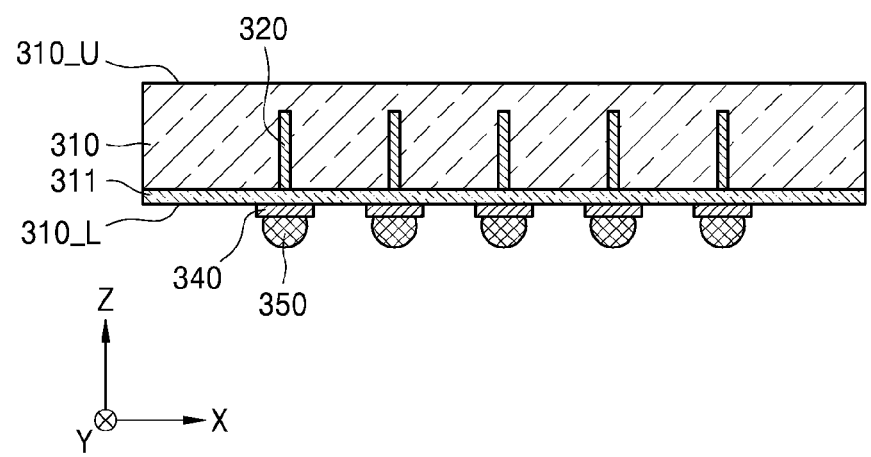
Figure 18:
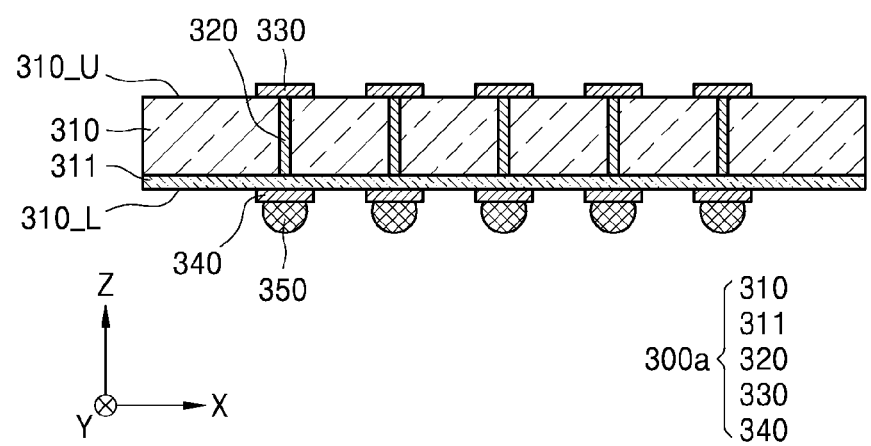

FIG. 17 illustrates an operation of forming the second lower pad 340 and a bump on the second semiconductor substrate 310 provided with the second active layer 311 and the second through electrode 320. FIG. 18 illustrates an operation of exposing the second through electrode 320 at the upper surface of the second semiconductor substrate 310, and forming the second upper pad 330. In some embodiments, the second lower pad 340 may be formed by using a photo process, an EP process, a strip process, a metal etching process, or the like, as in the bumper forming process.

Figure 19:
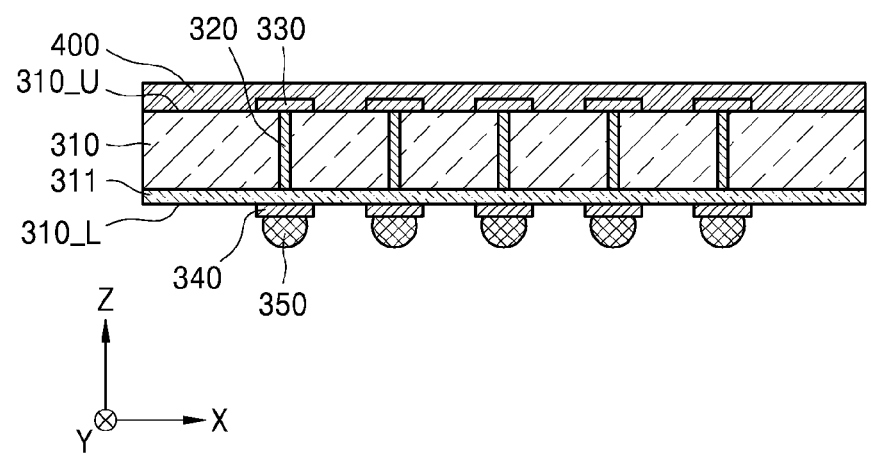
Figure 20:
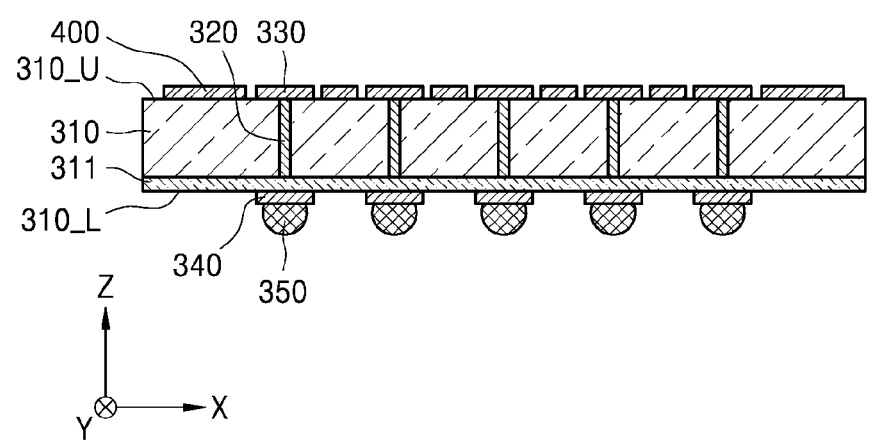

FIGS. 19 and 20 illustrate operations of forming the second polymer layer 400. In some embodiments, a process of forming the second polymer layer 400 may include a coating process, an exposure process, a development process, a cure process, or the like, as in the process of forming the first polymer layer 200.

In some embodiments, a thickness (e.g., the fourth thickness h4 of FIG. 11) of the second polymer layer 400 may be less than a thickness (e.g., the third thickness h3 of FIG. 11) of the second upper pad 330 of the second semiconductor chip 300. The pattern of the second polymer layer 400 may be a pattern, which has the third length D3 in the center region of the third semiconductor chip 500 and the fourth length D4 in the corner regions of the third semiconductor chip 500.

In other embodiments, the operation of forming the second polymer layer 400 may be omitted in a semiconductor package.

Figure 21:
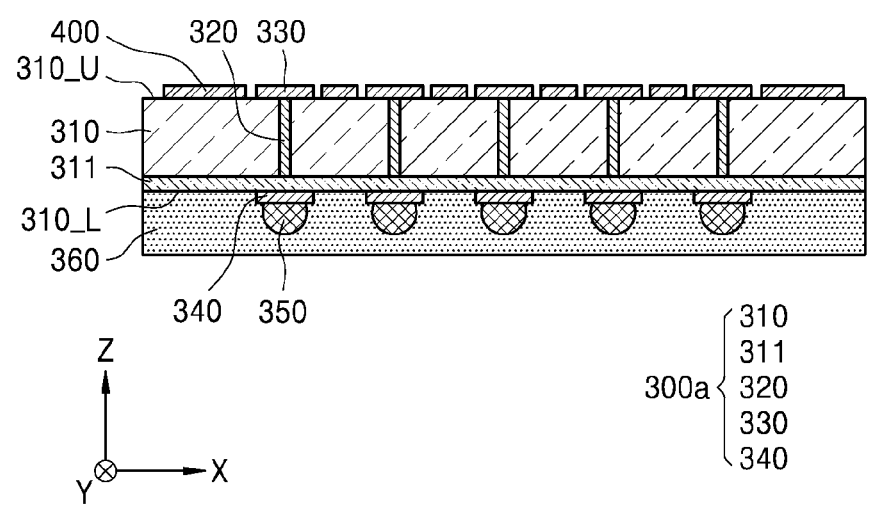

FIG. 21 illustrates an operation of forming the first adhesive layer 360 on the second active layer 311 of the second semiconductor chip 300. In some embodiments, before forming the first adhesive layer 360, the first semiconductor chip (100 of FIG. 18) may remain attached to a carrier, and a process of removing the carrier and attaching a dicing tape may be performed on the second semiconductor chip 300. Thereafter, a non-conductive film (NCF) lamination process may be performed on the second active layer 311 of the second semiconductor chip 300. In this case, the NCF laminating process may use a thin NCF.

Figure 22:
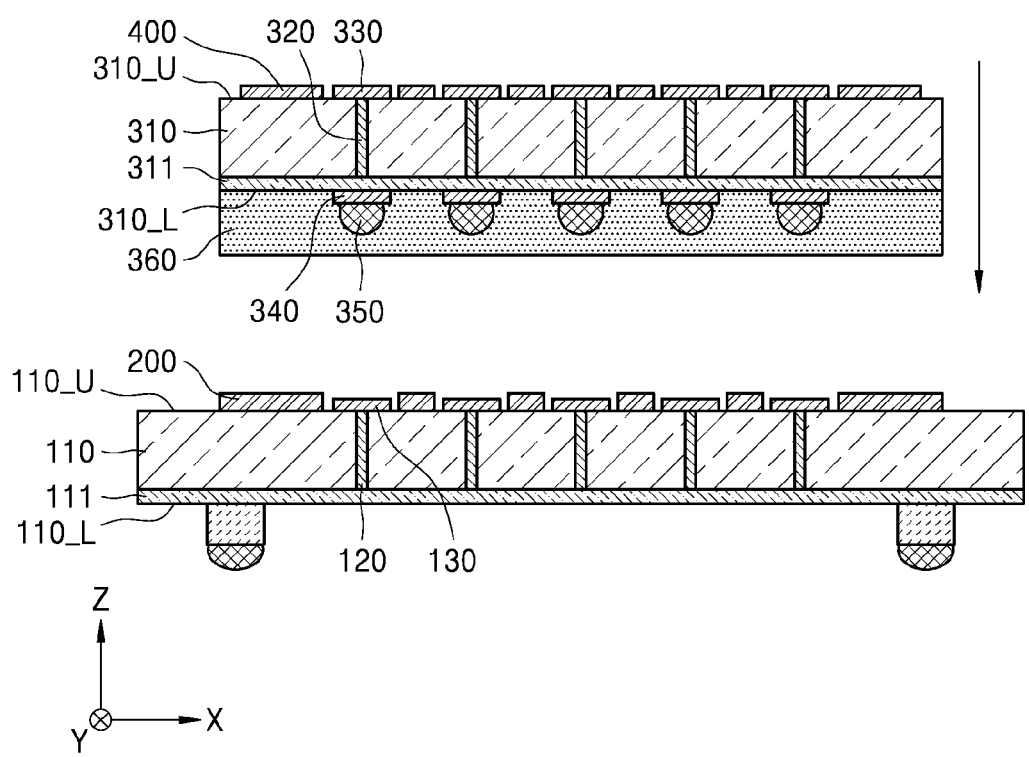
Figure 23:
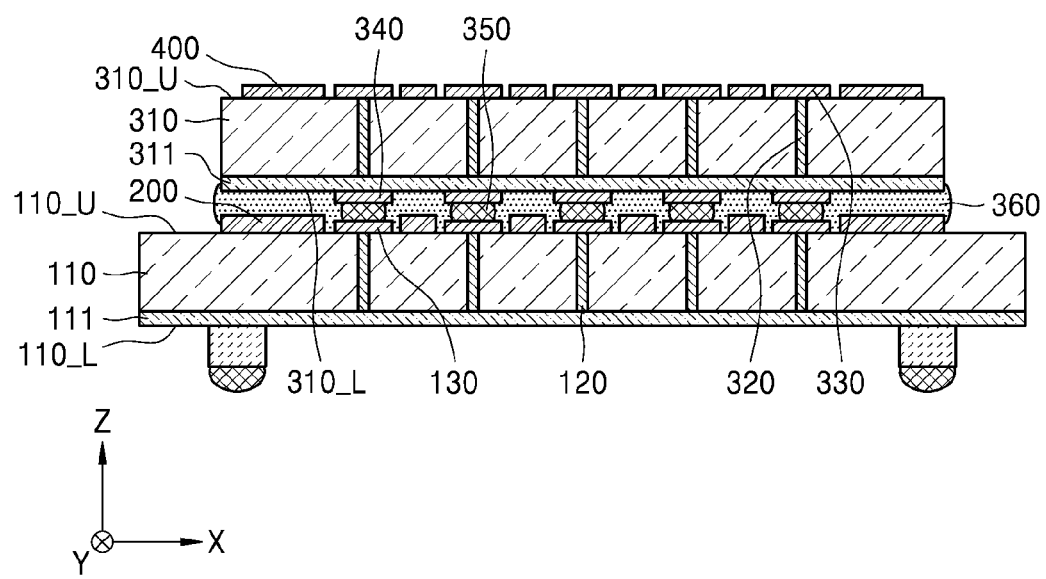
Figure 24:
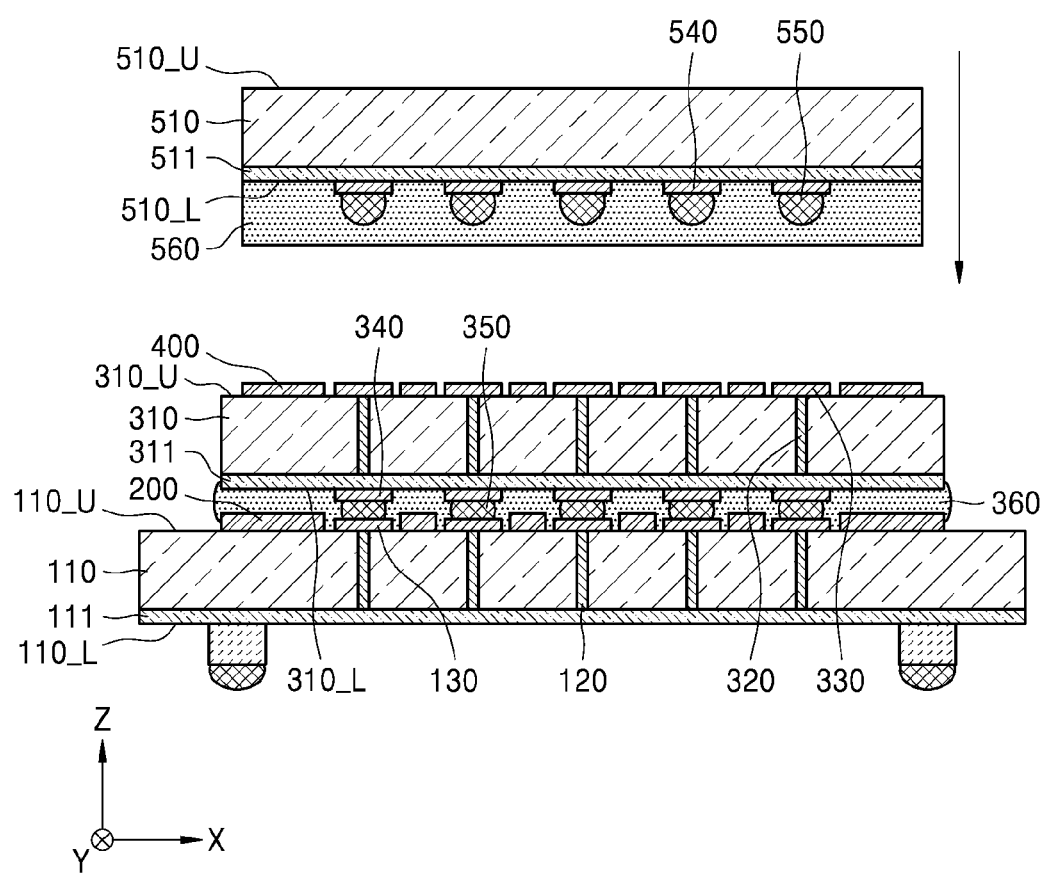
Figure 25:
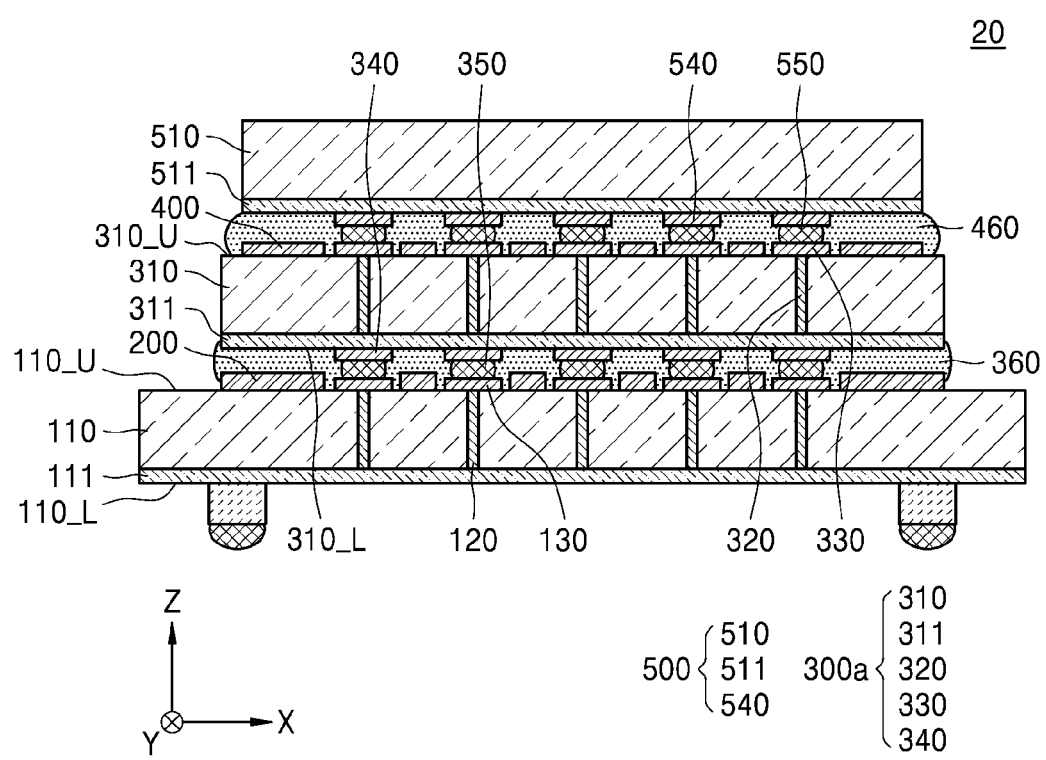

FIGS. 22 and 23 illustrate operations of bonding the first semiconductor chip 100 to the second semiconductor chip 300. FIGS. 24 and 25 illustrate operations of bonding the second semiconductor chip 300 to the third semiconductor chip 500. In some embodiments, the second semiconductor chip 300, on which the NCF has been applied, may be vertically lowered to the upper portion of the first semiconductor chip 100, and a thermal compression bonding process may be performed thereto. The process of bonding the third semiconductor chip 500 to the upper portion of the second semiconductor chip 300 may also include a thermal compression bonding. In some embodiments, a semiconductor package may include a plurality of second semiconductor chips 300 or a plurality of third semiconductor chips 500.

While the inventive concept has been particularly shown and described with reference to embodiments thereof, it will be understood that various changes in form and details may be made therein without departing from the spirit and scope of the following claims.

What is claimed is:
1. A semiconductor package comprising:
a first semiconductor chip including a first semiconductor substrate, a first through electrode penetrating in a vertical direction at least a portion of the first semicon- ductor substrate, and a first upper pad arranged on an upper surface of the first semiconductor substrate, connected to the first through electrode, and having a first thickness;

a first polymer layer arranged on the upper surface of the first semiconductor substrate and having a second thickness;

a second semiconductor chip mounted on the first semiconductor chip, the second semiconductor chip including a second semiconductor substrate and a second lower pad arranged under a lower surface of the second semiconductor substrate;

a first connection terminal arranged between the first upper pad of the first semiconductor chip and the second lower pad of the second semiconductor chip; and a first adhesive layer arranged between the first semiconductor chip and the second semiconductor chip, and surrounding each of the first upper pad, the second lower pad, and the first connection terminal, wherein the first polymer layer has a first length measured along a first straight line extending in a center region of the second semiconductor chip and a second length measured along a second straight line crossing two corner regions of the first polymer layer, wherein the two corner regions of the first polymer layer correspond to two corner regions of corner regions of the second semiconductor chip, wherein the first straight line and the second straight line that extend in a first direction are parallel with each other and are spaced apart from each other in a second direction different from the first direction, and the first and second directions are perpendicular to the vertical direction, and wherein the second length is greater than the first length.

2. The semiconductor package of claim 1,
wherein the first length of the first polymer layer is less than a third length between opposite edges, spaced apart from each other in the first direction, of the second semiconductor chip, and
wherein the second length of the first polymer layer is equal to the third length of the second semiconductor chip.

3. The semiconductor package of claim 1,
wherein the first polymer layer comprises a concave portion between the two corner regions of the second semiconductor chip, and
wherein the first adhesive layer fills the concave portion.

4. The semiconductor package of claim 1,
wherein the first length of the first polymer layer is a length selected from a range of about 60% to about 90% of a third length between opposite edges, spaced apart from each other in the first direction, of the second semiconductor chip.

5. The semiconductor package of claim 1,
wherein the second length of the first polymer layer is a length selected from a range of about 100% to about 120% of a third length between opposite edges, spaced apart from each other in the first direction, of the second semiconductor chip.

6. The semiconductor package of claim 1,
wherein the second thickness of the first polymer layer is greater than the first thickness of the first upper pad.

7. The semiconductor package of claim 1,
wherein the second thickness of the first polymer layer is a thickness selected from a range of about 100% to about 180% of the first thickness of the first upper pad.

8. The semiconductor package of claim 1,
wherein the center region of the second semiconductor chip comprises a center point of the lower surface of the second semiconductor substrate, and
wherein the corner regions of the second semiconductor chip comprise four vertices of the lower surface of the second semiconductor substrate, respectively.

9. The semiconductor package of claim 1,
wherein, when viewed in a plan view of the semiconductor package, a center point of the center region of the second semiconductor chip coincides with a center point of the lower surface of the second semiconductor substrate, and
wherein the center region of the second semiconductor chip has a first horizontal length, measured in the second direction, of about 60% to about 80% of a second horizontal length, measured in the second direction, of the lower surface of the second semiconductor substrate, and a first longitudinal length, measured in the first direction, of about 60% to about 80% of a second longitudinal length, measured in the first direction, of the second semiconductor chip.

10. The semiconductor package of claim 1,
wherein each corner region of the corner regions of the second semiconductor chip includes a corresponding vertex point of vertex points of the lower surface of the second semiconductor substrate, and
wherein each corner region of the corner regions of the second semiconductor chip has a first horizontal length, measured in the second direction, of about 10% to about 20% of a second horizontal length, measured in the second direction, of the lower surface of the second semiconductor substrate, and a first longitudinal length, measured in the first direction, of about 10% to about 20% of a second longitudinal length, measured in the first direction, of the lower surface of the second semiconductor substrate.

11. A semiconductor package comprising:
a first semiconductor chip including a first semiconductor substrate, a first through electrode penetrating in a vertical direction at least a portion of the first semiconductor substrate, and a first upper pad arranged on an upper surface of the first semiconductor substrate, connected to the first through electrode, and having a first thickness;
a first polymer layer arranged on the upper surface of the first semiconductor substrate and having a second thickness;
a second semiconductor chip mounted on the first semiconductor chip, the second semiconductor chip including a second semiconductor substrate, a second through electrode penetrating at least a portion of the second semiconductor substrate, a second lower pad arranged under a lower surface of the second semiconductor substrate, and a second upper pad arranged on an upper surface of the second semiconductor substrate, connected to the second through electrode, and having a third thickness;
a second polymer layer arranged on the upper surface of the second semiconductor substrate, and having a fourth thickness;
a third semiconductor chip mounted on the second semiconductor chip, the third semiconductor chip including a third semiconductor substrate and a third lower pad arranged under a lower surface of the third semiconductor substrate;

a first connection terminal arranged between the first upper pad of the first semiconductor chip and the second lower pad of the second semiconductor chip;

a second connection terminal arranged between the second upper pad of the second semiconductor chip and the third lower pad of the third semiconductor chip;

a first adhesive layer arranged between the first semiconductor chip and the second semiconductor chip, and surrounding each of the first upper pad, the second lower pad, and the first connection terminal; and a second adhesive layer arranged between the second semiconductor chip and the third semiconductor chip, and surrounding each of the second upper pad, the third lower pad, and the second connection terminal, wherein the first polymer layer has a first length measured along a first straight line extending in a center region of the second semiconductor chip and a second length measured along a second straight line crossing two corner regions of the first polymer layer, wherein the two corner regions of the first polymer layer correspond to two corner regions of corner regions of the second semiconductor chip, wherein the second length is greater than the first length, wherein the second polymer layer has a third length measured along a third straight line extending in a center region of the third semiconductor chip and a fourth length measured along a fourth straight line crossing two corner regions of the second polymer layer, wherein the two corner regions of the second polymer layer correspond to two corner regions of corner regions of the third semiconductor chip, wherein the fourth length is greater than the third length, wherein the first straight line, the second straight line, the third straight line, and the fourth straight line extend in a first direction and are parallel with each other, and wherein the first straight line, the second straight line, the third straight line, and the fourth straight line are spaced apart from each other in a second direction different from the first direction, and the first and second directions are perpendicular to the vertical direction.

12. The semiconductor package of claim 11,
wherein the third length of the second polymer layer is less than a fifth length between opposite edges, spaced apart from each other in the first direction, of the third semiconductor chip, and
wherein the fourth length of the second polymer layer is equal to the fifth length of the third semiconductor chip.

13. The semiconductor package of claim 11,
wherein the third length of the second polymer layer is a length selected from a range of about 60% to about 90% of a fifth length between opposite edges, spaced apart from each other in the first direction, of the third semiconductor chip.

14. The semiconductor package of claim 11,
wherein the fourth length of the second polymer layer is a length selected from a range of about 100% to about 120% of a fifth length between opposite edges, spaced apart from each other in the first direction, of the third semiconductor chip.

15. The semiconductor package of claim 11,
wherein the fourth thickness of the second polymer layer is less than a third thickness of the second lower pad.

16. The semiconductor package of claim 11,
wherein the fourth thickness of the second polymer layer is a thickness selected from a range of about 60% to about 100% of a third thickness of the second lower pad.

17. The semiconductor package of claim 11,
wherein the first polymer layer comprises a hole accommodating the first upper pad, and
wherein the second polymer layer comprises a hole accommodating the second upper pad.

18. The semiconductor package of claim 11, further comprising a sealing material sealing the first semiconductor chip, the second semiconductor chip, and the third semiconductor chip.

19. The semiconductor package of claim 11,
wherein a material constituting an adhesive layer comprises at least one of a non-conductive film, a non-conductive paste, and an insulating polymer.

20. A semiconductor package comprising:
a first semiconductor chip including a first semiconductor substrate, a first through electrode penetrating in a vertical direction at least a portion of the first semiconductor substrate, and a first upper pad arranged on an upper surface of the first semiconductor substrate, connected to the first through electrode, and having a first thickness;

a first polymer layer arranged on the upper surface of the first semiconductor substrate and having a second thickness;

a second semiconductor chip mounted on the first semiconductor chip, the second semiconductor chip including a second semiconductor substrate, a second through electrode penetrating at least a portion of the second semiconductor substrate, a second lower pad arranged under a lower surface of the second semiconductor substrate, and a second upper pad arranged on an upper surface of the second semiconductor substrate, connected to the second through electrode, and having a third thickness;

a second polymer layer arranged on the upper surface of the second semiconductor substrate and having a fourth thickness;

a third semiconductor chip mounted on the second semiconductor chip, the third semiconductor chip including a third semiconductor substrate, and a third lower pad arranged under a lower surface of the third semiconductor substrate;

a first connection terminal arranged between the first upper pad of the first semiconductor chip and the second lower pad of the second semiconductor chip;

a second connection terminal arranged between the second upper pad of the second semiconductor chip and the third lower pad of the third semiconductor chip;

a first adhesive layer arranged between the first semiconductor chip and the second semiconductor chip, and surrounding each of the first upper pad, the second lower pad, and the first connection terminal; and a second adhesive layer arranged between the second semiconductor chip and the third semiconductor chip, and surrounding each of the second upper pad, the third lower pad, and the second connection terminal, wherein the first polymer layer has a first length measured along a first straight line extending in a center region of the second semiconductor chip and a second length measured along a second straight line crossing two corner regions of the first polymer layer, wherein the two corner regions of the first polymer layer correspond to two corner regions of corner regions of the second semiconductor chip, wherein the second length is greater than the first length, wherein the second polymer layer has a third length measured along a third straight line extending in a center region of the third semiconductor chip and a fourth length measured along a fourth straight line crossing two corner regions of the second polymer layer, wherein the two corner regions of the second polymer layer correspond to two corner regions of corner regions of the third semiconductor chip, wherein the fourth length is greater than the third length, wherein the first straight line, the second straight line, the third straight line, and the fourth straight line extend in a first direction and are parallel with each other, wherein the first straight line, the second straight line, the third straight line, and the fourth straight line are spaced apart from each other in a second direction different from the first direction, and the first and second directions are perpendicular to the vertical direction, wherein the center region of the second semiconductor chip comprises a center point of the lower surface of the second semiconductor substrate, wherein the corner regions of the second semiconductor chip comprise four vertex points of the lower surface of the second semiconductor substrate, respectively, wherein the first length of the first polymer layer is a length selected from a range of about 60% to about 90% of a fifth length between opposite edges, spaced apart from each other in the first direction, of the second semiconductor chip, and the second length of the first polymer layer is a length from a range of about 100% to about 120% of the fifth length between of the second semiconductor chip, wherein the third length of the second polymer layer is a length selected from a range of about 60% to about 90% of a sixth length between opposite edges, spaced apart from each other in the first direction, of the third semiconductor chip, and the fourth length of the second polymer layer is a length selected from a range of about 100% to about 120% of the sixth length of the third semiconductor chip, wherein the second thickness of the first polymer layer is a thickness selected from a range of about 100% to about 180% of the first thickness of the first upper pad, and wherein the fourth thickness of the second polymer layer is a thickness selected from a range of about 60% to about 100% of the third thickness of the second lower pad.

* * * * *